(12) United States Patent
Kawashima

(10) Patent No.: US 9,772,560 B2
(45) Date of Patent: Sep. 26, 2017

(54) LIGHT SOURCE APPARATUS, ILLUMINATION DEVICE, EXPOSURE APPARATUS, AND DEVICE MANUFACTURING METHOD

(71) Applicant: CANON KABUSHIKI KAISHA, Tokyo (JP)

(72) Inventor: Haruna Kawashima, Haga-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/814,698

(22) Filed: Jul. 31, 2015

(65) Prior Publication Data

US 2016/0041472 A1   Feb. 11, 2016

(30) Foreign Application Priority Data

Aug. 5, 2014  (JP) ................................. 2014-159144
Sep. 11, 2014  (JP) ................................. 2014-184748

(51) Int. Cl.
 *G03F 7/20*   (2006.01)
 *G02B 19/00*   (2006.01)
 (Continued)

(52) U.S. Cl.
 CPC ............ G03F 7/70175 (2013.01); *G02B 5/10* (2013.01); *G02B 17/0657* (2013.01);
 (Continued)

(58) Field of Classification Search
 CPC ............ G02B 17/0657; G02B 19/0023; G02B 19/0047; G02B 5/09; G02B 5/10;
 (Continued)

(56) References Cited

U.S. PATENT DOCUMENTS

| | | | | |
|---|---|---|---|---|
| 4,956,759 A | * | 9/1990 | Goldenberg | ........ F21S 48/1388 |
| | | | | 359/858 |
| 5,272,570 A | * | 12/1993 | Yoshida | .................... F21V 7/09 |
| | | | | 359/850 |

(Continued)

FOREIGN PATENT DOCUMENTS

| CN | 1401065 A | 3/2003 |
|---|---|---|
| CN | 1771072 A | 5/2006 |

(Continued)

OTHER PUBLICATIONS

Office Action issued in Taiwanese Appln. No. 104122159 dated Jul. 22, 2016. English translation provided.

(Continued)

*Primary Examiner* — Christina Riddle
(74) *Attorney, Agent, or Firm* — Rossi, Kimms & McDowell LLP

(57) ABSTRACT

A light source apparatus including a light source configured to emit a light flux from an emission region having a predetermined size and a rotationally symmetrical emission intensity distribution; and a condenser configured to condense the light flux to allow the light flux to exit to the outside. The condenser is rotationally symmetrical about an optical axis and is disposed to surround the emission region, and has four or more reflection mirrors each having a reflecting surface for reflecting the light flux emitted from the emission region. The reflection mirrors include elliptical surface reflection mirrors where the reflecting surface is elliptical and spherical surface reflection mirrors where the reflecting surface is spherical, and are alternately arranged in the direction of the optical axis, and a light flux reflected by one spherical surface reflection mirror is further reflected by one elliptical surface reflection mirror oppositely disposed across the emission region.

16 Claims, 26 Drawing Sheets

(51) Int. Cl.
*G02B 17/06* (2006.01)
*G02B 5/10* (2006.01)
*G02B 5/09* (2006.01)

(52) U.S. Cl.
CPC ..... *G02B 19/0023* (2013.01); *G02B 19/0047* (2013.01); *G02B 5/09* (2013.01)

(58) Field of Classification Search
CPC .......... G03F 7/70175; G03F 7/70008–7/7005; G03F 7/7015; G03F 7/70166; G03F 7/702
USPC ......... 355/52, 53, 55, 67–71, 77; 250/492.1, 250/492.2, 492.22, 492.23, 493.1, 504 R; 359/850, 855, 866, 868
See application file for complete search history.

(56) References Cited

U.S. PATENT DOCUMENTS

| | | | |
|---|---|---|---|
| 5,594,831 A | 1/1997 | Oparin et al. | |
| 5,713,660 A * | 2/1998 | Mori | G03F 7/70091 353/38 |
| 6,118,577 A * | 9/2000 | Sweatt | G03F 7/70066 355/67 |
| 6,188,933 B1 * | 2/2001 | Hewlett | G02B 26/0833 359/291 |
| 6,312,144 B1 | 11/2001 | Li | |
| 6,639,652 B1 * | 10/2003 | Mori | G03F 7/70175 355/53 |
| 7,213,944 B2 | 5/2007 | Shimaoka et al. | |
| 7,309,871 B2 | 12/2007 | Bowering | |
| 7,736,028 B2 | 6/2010 | Shimaoka | |
| 7,871,165 B2 | 1/2011 | Silverstein et al. | |
| 2002/0071108 A1 * | 6/2002 | Go | G03F 7/70041 355/71 |
| 2006/0131515 A1 * | 6/2006 | Partlo | B82Y 10/00 250/504 R |
| 2006/0193146 A1 * | 8/2006 | Li | F21V 7/0025 362/551 |

FOREIGN PATENT DOCUMENTS

| | | |
|---|---|---|
| CN | 1809785 A | 7/2006 |
| CN | 1811493 A | 8/2006 |
| CN | 2881327 Y | 3/2007 |
| CN | 101878655 A | 11/2010 |
| CN | 203190102 U | 9/2013 |
| JP | 3151534 B2 | 4/2001 |
| JP | 2001358071 A | 12/2001 |
| JP | 2010108604 A | 5/2010 |
| JP | 4640688 B2 | 3/2011 |
| JP | 4705852 B2 | 6/2011 |
| TW | 489379 | 6/2002 |
| TW | 201131320 A | 9/2011 |

OTHER PUBLICATIONS

Office Action issued in Chinese Patent Application No. 201510484698.3 dated Jan. 22, 2017. English translation provided.

* cited by examiner

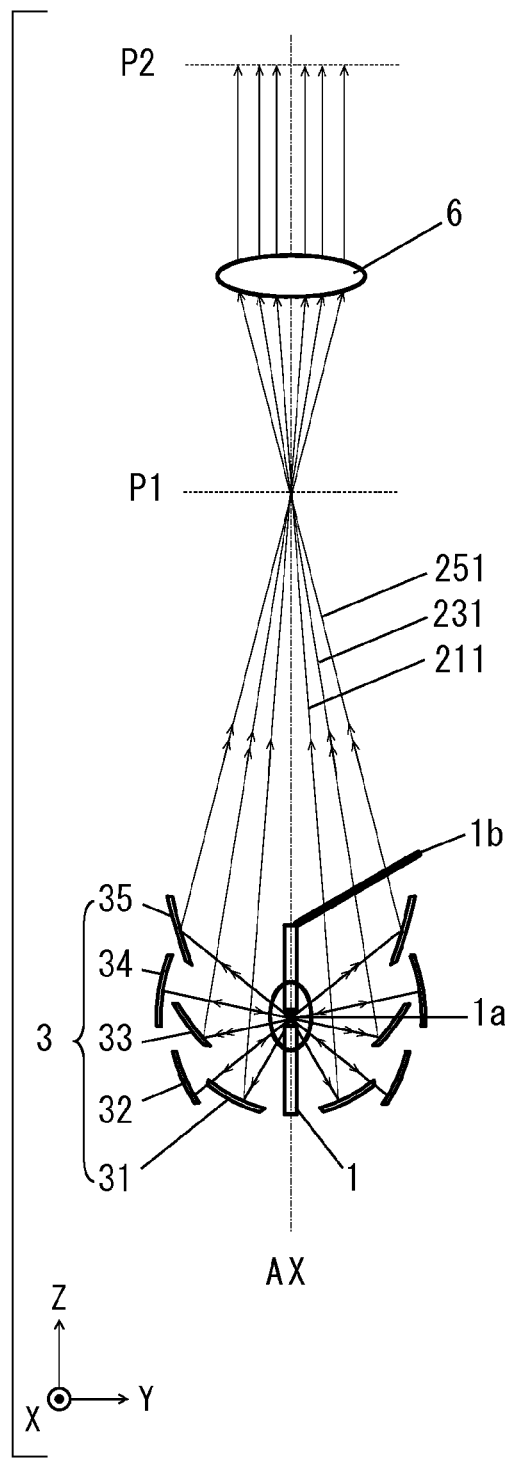
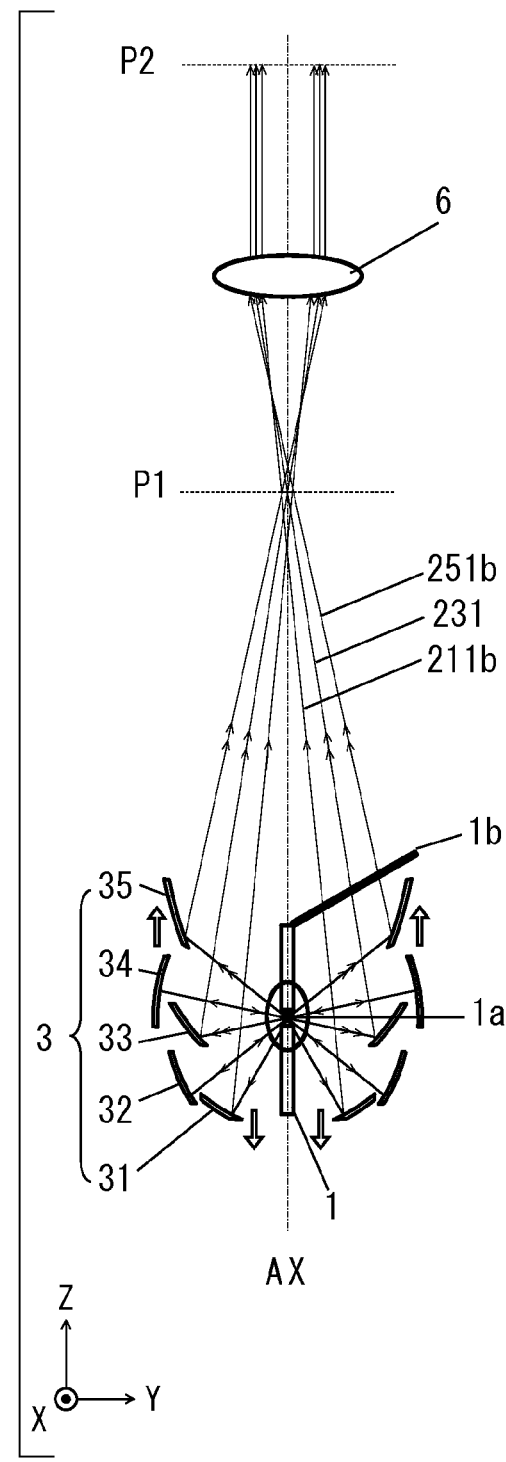
FIG. 14A
FIG. 14B

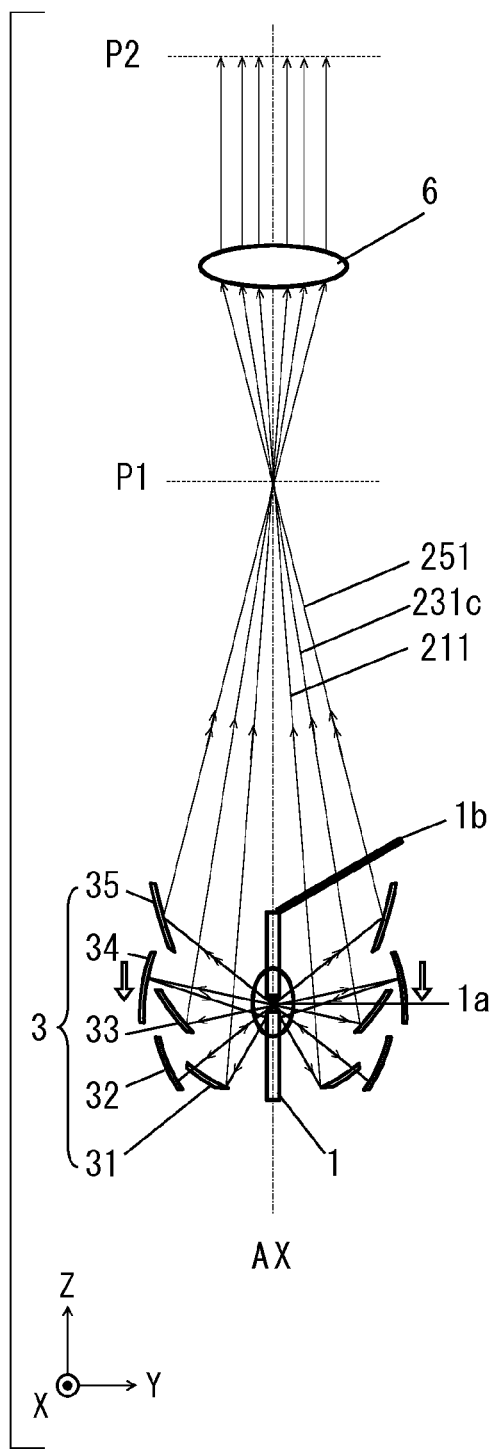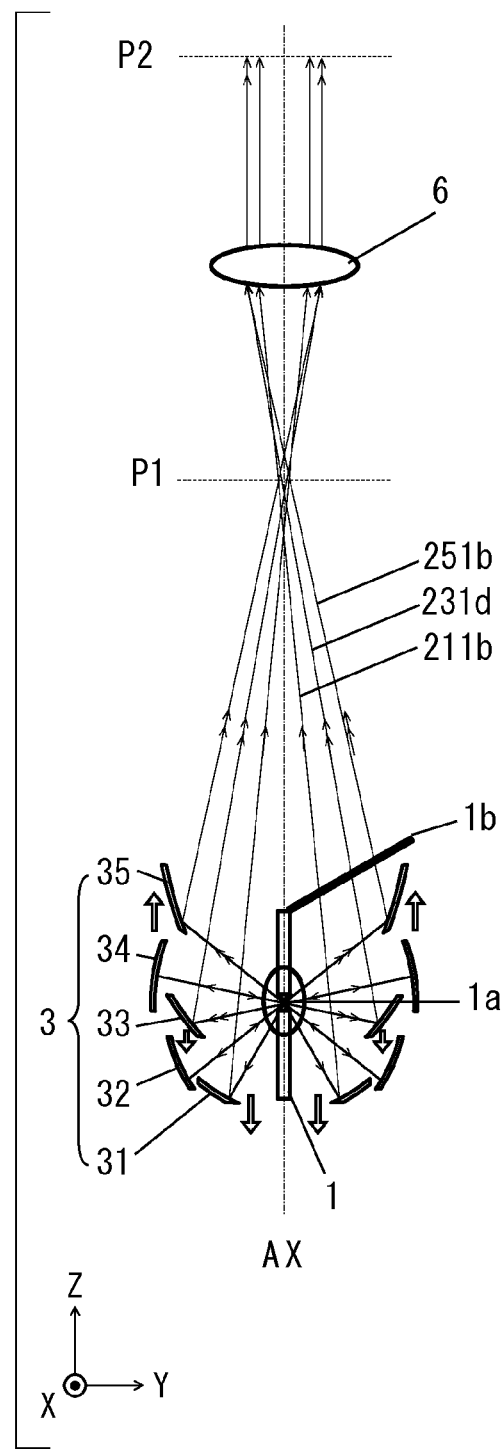

FIG. 25A
FIG. 25B
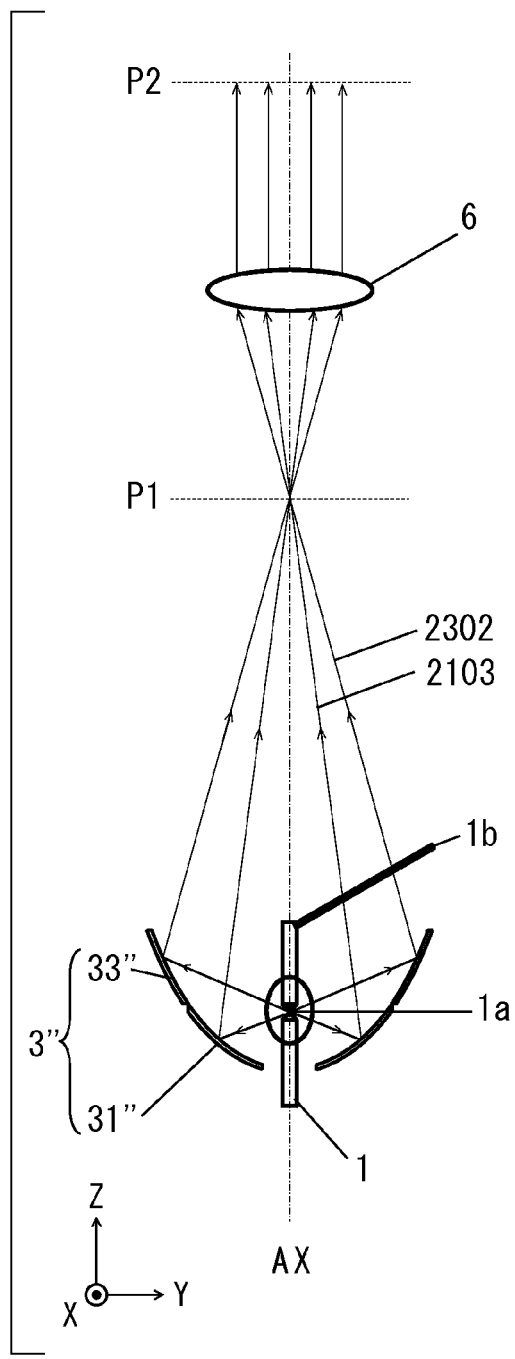
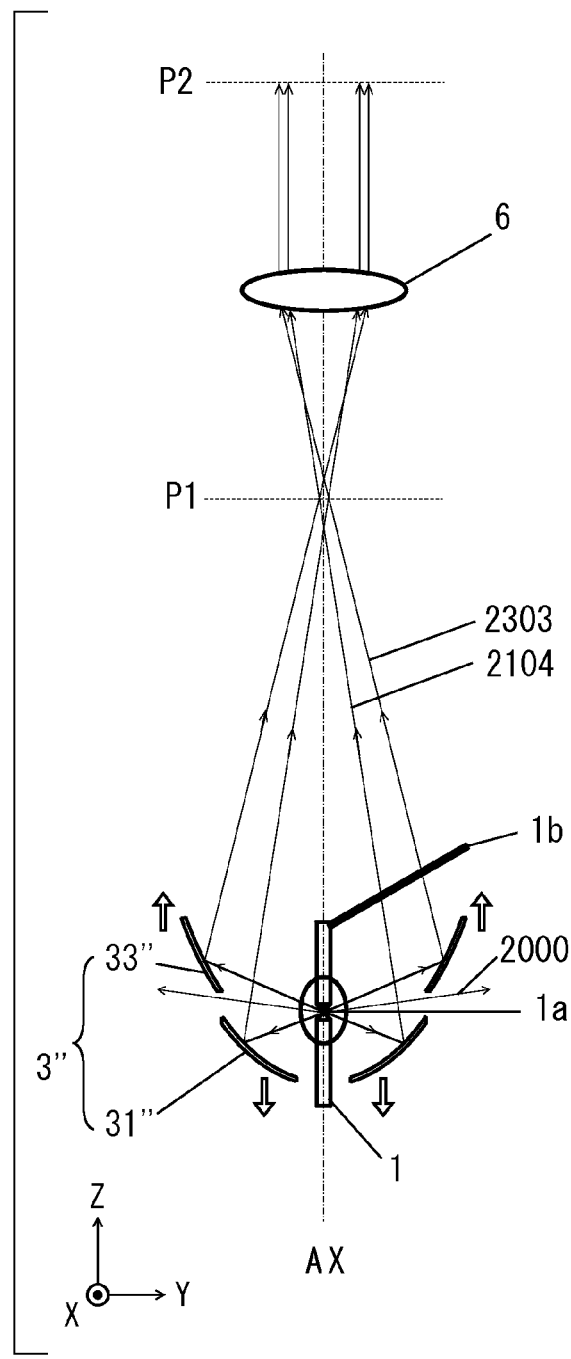

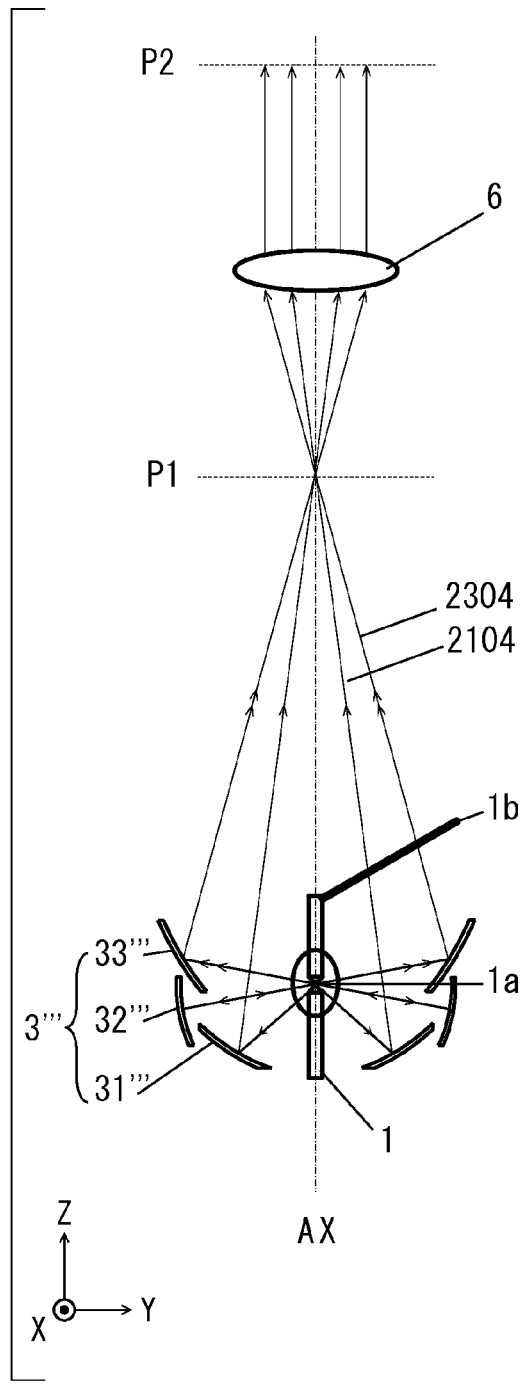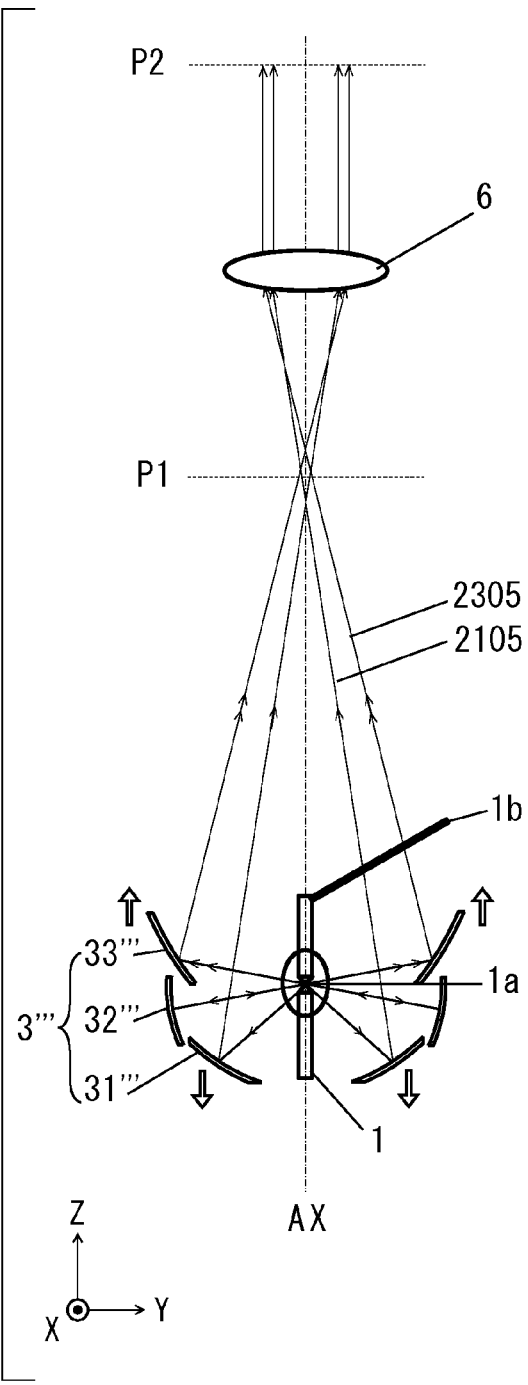

LIGHT SOURCE APPARATUS, ILLUMINATION DEVICE, EXPOSURE APPARATUS, AND DEVICE MANUFACTURING METHOD

BACKGROUND OF THE INVENTION

Field of the Invention

The present invention relates to a light source apparatus, an illumination device, an exposure apparatus, and a device manufacturing method.

Description of the Related Art

Exposure apparatuses that transfer a pattern formed on an original (reticle or the like) onto a substrate (a wafer or the like where the surface thereof is coated with a resist layer) via a projection optical system are employed in a lithography step included in manufacturing steps of semiconductor devices and the like. The exposure apparatus includes an illumination device that illuminates an original with a light flux emitted from a light source apparatus which condenses and emits light flux emitted from a light source. Japanese Patent No. 4640688 discloses a light source apparatus (illumination device) that employs a high pressure mercury lamp as a light source and an elliptical mirror as a condenser. In the light source apparatus, the light emitting point of the high pressure mercury lamp is positioned in the vicinity of the first focal point of the elliptical mirror so as to condense a light flux emitted from the light emitting point in the vicinity of the second focal point of the elliptical mirror. Japanese Patent No. 3151534 discloses a light source apparatus (light source unit) that employs a two-stage structured condenser configured to include an elliptical mirror and a spherical mirror in this order from the first focal point toward the second focal point of the elliptical mirror so as to reduce the maximum incident angle of the light flux condensed thereby. On the other hand, Japanese Patent No. 4705852 discloses a light source apparatus that employs a two-stage structured condenser configured to include a spherical mirror and an elliptical mirror in this order from the first focal point toward the second focal point of the elliptical mirror so as to reduce the condensed diameter of the light flux condensed thereby. Japanese Patent Laid-Open No. 2001-358071 discloses an exposure apparatus that changes an image of a secondary light source which is circular in shape to an annular shape by inserting a circular cone prism into the pupil position of a fly-eye lens on the side of the light source with a lens placed in-between.

However, in these techniques disclosed in the above Patent Documents, the maximum incident angle and the condensed diameter of the light flux condensed by the condenser and the maximum diameter of the condenser mirror(s) constituting the condenser cannot be reduced simultaneously. Thus, there is room for improvement in the utilization of a light flux emitted from a light source more efficiently.

SUMMARY OF THE INVENTION

The present invention has been made under the circumstances as described above, and an object of the present invention is to provide, for example, a light source apparatus that is advantageous in terms of the utilization efficiency of light flux emitted from a light source.

According to an aspect of the present invention, a light source apparatus is provided that includes a light source configured to emit a light flux from an emission region having a predetermined size; and a condenser configured to condense the light flux so as to allow the light flux to exit to the outside, wherein the emission region has a rotationally symmetrical emission intensity distribution, the condenser is rotationally symmetrical about the optical axis defined as the rotationally symmetrical axis of the emission region, is disposed so as to surround the emission region, and has four or more reflection mirrors each having a reflecting surface for reflecting the light flux emitted from the emission region, the four or more reflection mirrors include elliptical surface reflection mirrors of which the reflecting surface is elliptical and spherical surface reflection mirrors of which the reflecting surface is spherical, and the elliptical surface reflection mirrors and the spherical surface reflection mirrors are alternately arranged in the direction of the optical axis, and a light flux reflected by the one spherical surface reflection mirror is further reflected by the one elliptical surface reflection mirror oppositely disposed across the emission region so as to allow the light flux to exit to the outside.

Further features of the present invention will become apparent from the following description of exemplary embodiments with reference to the attached drawings.

BRIEF DESCRIPTION OF THE DRAWINGS

FIG. 14A is a diagram illustrating a configuration of an illumination system for explaining a light intensity distribution.

FIG. 14B is a diagram illustrating a configuration of an illumination system for explaining a light intensity distribution.

FIG. 15A is a diagram illustrating a configuration of an illumination system for explaining a light intensity distribution.

FIG. 15B is a diagram illustrating a configuration of an illumination system for explaining a light intensity distribution.

FIG. 25A is a diagram illustrating another configuration of an illumination system for explaining a light intensity distribution.

FIG. 25B is a diagram illustrating another configuration of an illumination system for explaining a light intensity distribution.

FIG. 26A is a diagram illustrating another configuration of an illumination system for explaining a light intensity distribution.

FIG. 26B is a diagram illustrating another configuration of an illumination system for explaining a light intensity distribution.

DESCRIPTION OF THE EMBODIMENTS

Hereinafter, preferred embodiments of the present invention will be described with reference to the drawings.

(First Embodiment)

Firstly, a description will be given of a light source apparatus according to a first embodiment of the present invention. The light source apparatus according to the present embodiment is employed, for example, in the illumination device (illumination system) provided in an exposure apparatus which is used in a lithography step included in manufacturing steps of semiconductor devices and the like and emits light flux toward a predetermined position (area). Hereinafter, in order to clarify the characteristic of the light source apparatus according to the present embodiment, a description will be firstly given of two conventional light source apparatus and then a description will be given of the light source apparatus according to the present embodiment as compared with the conventional light source apparatus.

Figure 11A:
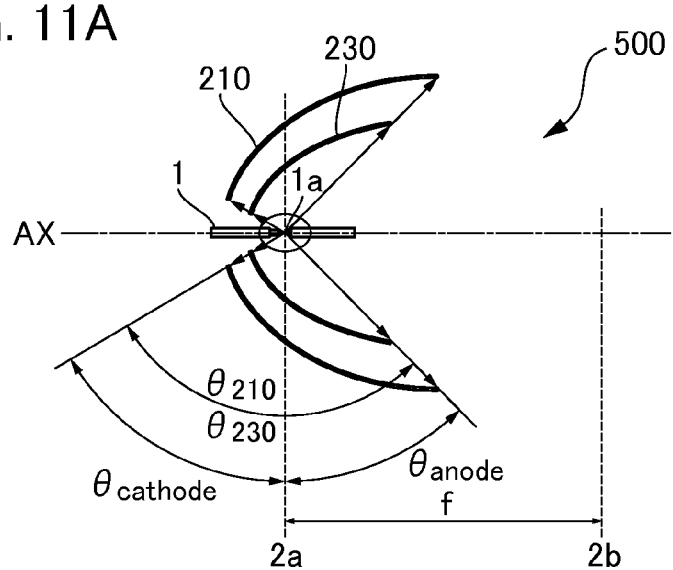
FIG. 11A is a diagram illustrating a configuration of a first example of a conventional light source apparatus.
Figure 11B:
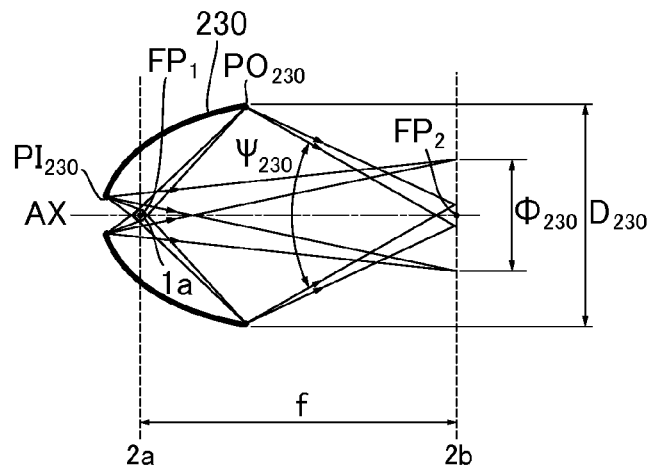
FIG. 11B is a diagram illustrating a configuration of a first example of a conventional light source apparatus.
Figure 11C:
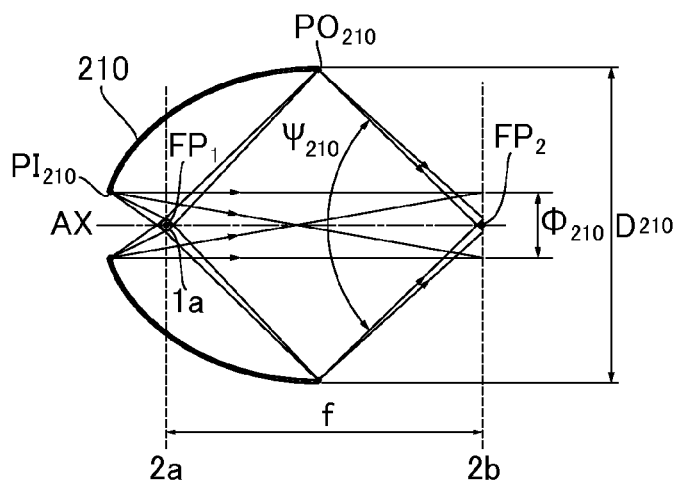
FIG. 11C is a diagram illustrating a configuration of a first example of a conventional light source apparatus.

FIGS. 11A to 11C are schematic cross-sectional views illustrating a configuration of a light source apparatus 500 in which a light source 1 is a high pressure mercury lamp and a condenser is a single elliptical mirror (elliptical surface reflection mirror) as a first example of the conventional light source apparatus. Among them, FIG. 11A is a diagram illustrating the relationship between a reflection angle at which the light flux is reflected by two major and minor elliptical mirrors each having a rotationally symmetrical shape around the optical axis AX with different eccentricities and a radiation angle at which the light flux is emitted by the light source 1. The light source 1 has two electrodes, i.e., cathode and anode, and emits light flux from a light emitting point (emission region) 1a which is formed between the electrodes and has a predetermined size. The light emitting point 1a has a rotationally symmetrical emission intensity distribution. It can be said that the optical axis AX is the rotationally symmetrical axis of the light emitting point 1a. At this time, a portion of the light flux emitted from the light source 1 is shielded by the cathode and anode positioned in the vicinity of the light emitting point 1a, and thus, the radiation angle is limited to a range of a predetermined angle θcathode and a predetermined angle θanode which are represented by using a first auxiliary line 2a as a boundary. A first elliptical mirror 210 having a large outer diameter and a second elliptical mirror 230 having a small outer diameter share two focal points on the optical axis AX, and the angle θ210 at which the light flux is reflected by the first elliptical mirror 210 is equal to the angle θ230 at which the light flux is reflected by the second elliptical mirror 230. The first auxiliary line 2a is a line drawn at the position of the first focal point on the optical axis AX, and a second auxiliary line 2b is a line drawn at the position of the second focal point on the optical axis AX. In FIGS. 11A to 11C, the distance (the distance between two focal points) between the first focal point and the second focal point is represented by symbol "f". In the light source 1, the elliptical mirrors 210 and 230 are positioned such that the light emitting point 1a substantially coincides with the first focal point of each of the elliptical mirrors 210 and 230.

FIG. 11B is a diagram illustrating the maximally condensed diameter Φ230 and the maximally condensed angle Ψ230 of the light flux condensed by the second elliptical mirror 230 and the maximum reflection mirror outer diameter D 230 of the second elliptical mirror 230. Note that FIG. 11B is a simplified representation of a general view of the light source 1, shows a condensed state of a light beam emitted from the outermost periphery of the light emitting point 1a having a predetermined size, and explicitly shows a first focal point FP1, a second focal point FP2, a reflection point PI 230, and a reflection point PO 230. Firstly, consider the condensed diameter of light flux based on the assumption that the reflecting surface of the second elliptical mirror 230 is constituted by a continuous microscopic plane. If the reflection point PI 230 is a microscopic plane, the spread angle of incident light flux at the reflection point PI 230 can be approximated to be equal to the spread angle of reflected light. Likewise, the spread angle of incident light flux at the reflection point PO 230 can be approximated to be equal to the spread angle of reflected light. When the spread angle of incident light flux at the reflection point is equal to the spread angle of reflected light, the condensed diameter formed by reflected light can be approximated by multiplying the diameter of the light emitting point 1a by the ratio of the distance from the reflection point to the second focal point FP2 to the distance from the reflection point to the first focal point FP1. Thus, the maximally condensed diameter Φ230 is a spread which is formed on the plane perpendicular to the optical axis AX including the second focal point FP2 by light reflected at the reflection point PI 230 closest to the light emitting point 1a on the second elliptical mirror 230. In contrast, the maximally condensed angle Ψ230 is the angle formed by light beams each having an intersection point located closer to the side of the first focal point FP1 on the optical axis AX from among the light beams which are reflected at the reflection point PO 230 closest to the second focal point FP2 on the second elliptical mirror 230. The maximum reflection mirror outer diameter D 230 is the outer diameter formed by the aperture on the side of the second focal point FP2 of the second elliptical mirror 230. If the maximally condensed diameter of light flux condensed by the second elliptical mirror 230 is reduced with the two focal points FP1 and FP2 of the second elliptical mirror 230 fixed, the distance from the reflection point on the elliptical mirror closest to the light emitting point 1a to the first focal point FP1 may be increased.

FIG. 11C is a diagram illustrating the maximally condensed diameter Φ210 and the maximally condensed angle Ψ210 of the light flux condensed by the first elliptical mirror 210 and the maximum reflection mirror outer diameter D 210 of the first elliptical mirror 210. Note that FIG. 11C is also a simplified representation of a general view of the light source 1, shows a condensed state of a light beam emitted from the outermost periphery of the light emitting point 1a having a predetermined size, and explicitly shows the first focal point FP1, the second focal point FP2, a reflection point PI 210, and a reflection point PO 210. As in the second elliptical mirror 230, the maximally condensed diameter Φ210 of the first elliptical mirror 210 is a spread which is formed on the plane perpendicular to the optical axis AX including the second focal point FP2 by light reflected at the reflection point PI 210 closest to the light emitting point 1a on the first elliptical mirror 210. Here, the maximally condensed diameter Φ210 is less than the maximally condensed diameter Φ230 of the second elliptical mirror 230. The maximally condensed angle Ψ210 is greater than the maximally condensed angle Ψ230 of the second elliptical mirror 230. The maximum reflection mirror outer diameter D 210 is greater than the maximum reflection mirror outer diameter D 230 of the second elliptical mirror 230.

As described above, in the conventional light source apparatus 500 in which the condenser is a single elliptical mirror, even if the shape (eccentricity) of the elliptical mirror is varied, the values of the maximally condensed diameter Φ, the maximally condensed angle Ψ, and the maximum reflection mirror outer diameter D of the condenser cannot be simultaneously reduced.

Figure 12A:
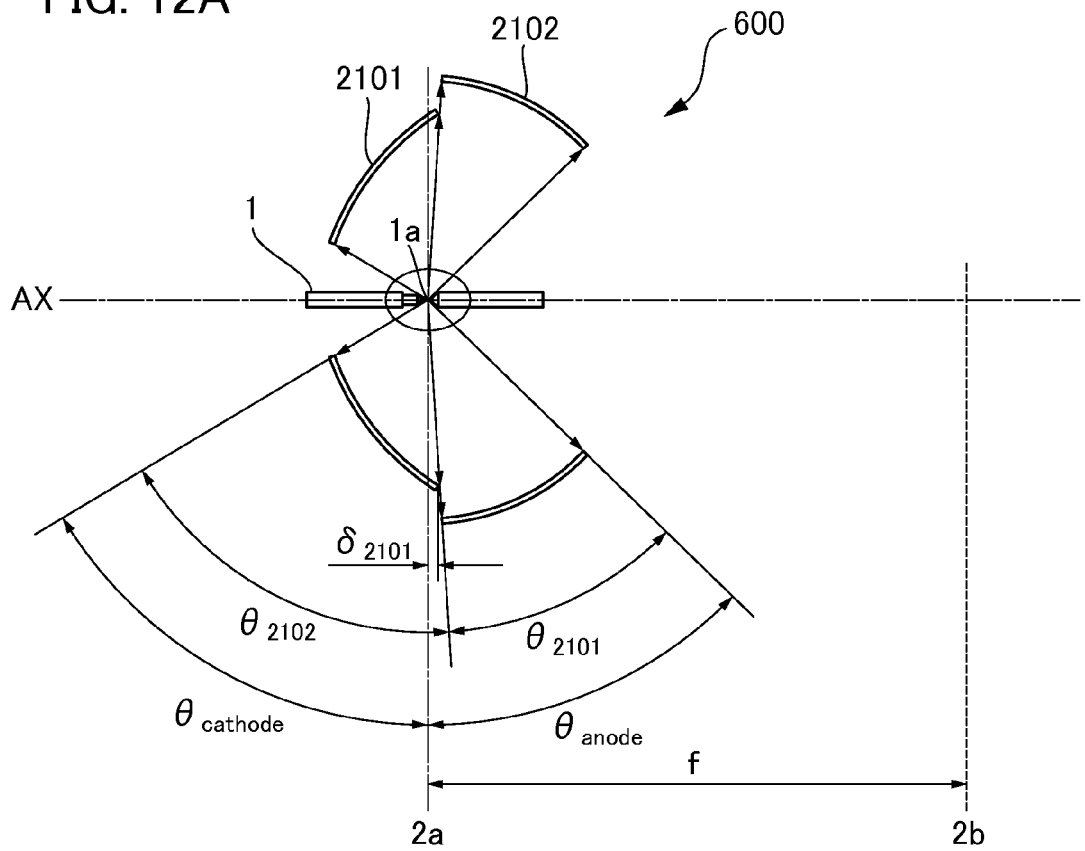
FIG. 12A is a diagram illustrating a configuration of a second example of a conventional light source apparatus.
Figure 12B:
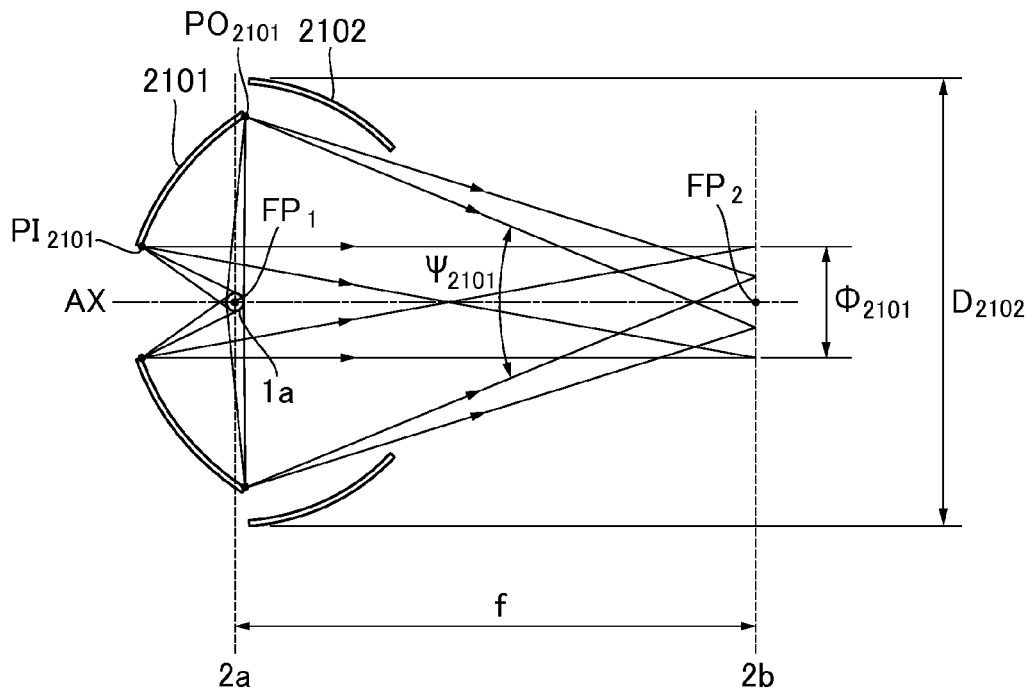
FIG. 12B is a diagram illustrating a configuration of a second example of a conventional light source apparatus.

FIGS. 12A and 12B are schematic cross-sectional views illustrating a configuration of a light source apparatus 600 in which the light source 1 is a high pressure mercury lamp and the condenser is a two-stage structured condenser configured to include one elliptical mirror (elliptical surface reflection mirror) and one spherical mirror (spherical surface reflection mirror) in this order as a second example of the conventional light source apparatus. Among them, FIG. 12A is a diagram illustrating the relationship between a reflection angle at which the light flux is reflected by a first elliptical mirror 2101 and a first spherical mirror 2102 each having a rotationally symmetrical shape around the optical axis AX and a radiation angle at which the light flux is emitted by the light source 1. The first elliptical mirror 2101 and the first spherical mirror 2102 are defined as the two-stage structured condenser which is the replacement of the first elliptical mirror 210 in the first example, and the first elliptical mirror 2101 is configured such that the aperture of the first elliptical mirror 210 in the first example on the side of the second focal point FP2 is reduced. FIG. 12A shows the case where the size of the aperture of the first elliptical mirror 2101 on the side of the second focal point FP2 is equal to the size (D 230) of the aperture of the second elliptical mirror 230 in the first example on the side of the second focal point FP2. The central point of the first spherical mirror 2102 is substantially at the same position as the first focal point of the first elliptical mirror 2101. The reflection angle of the first spherical mirror 2102 on the side of the second focal point FP2 is the same as the radiation angle θanode of the light source 1 on the side of the second focal point FP2. The aperture end of the first elliptical mirror 2101 on the side of the first auxiliary line 2*a* is overhung by a distance δ2101, which is determined by the spacing between the cathode and the anode of the light source 1, toward the first spherical mirror 2102 across the first auxiliary line 2*a*. This is because, if the aperture end of the first spherical mirror 2102 extends to the first auxiliary line 2*a*, to avoid the repetition of multiple reflection such that a portion of the light flux returned to the vicinity of the light emitting point 1*a* of the light source 1 by the first spherical mirror 2102 is again reflected by the first spherical mirror 2102.

FIG. 12B is a diagram illustrating the maximally condensed diameter Φ2101 and the maximally condensed angle Ψ2101 of light flux condensed by a condenser consisting of the first elliptical mirror 2101 and the first spherical mirror 2102, and the maximum reflection mirror outer diameter D 2101 of the condenser. Note that FIG. 12B is a simplified representation of a general view of the light source 1, shows a condensed state of a light beam emitted from the outermost periphery of the light emitting point 1*a* having a predetermined size, and explicitly shows the first focal point FP1, the second focal point FP2, the reflection point PI 2101, and the reflection point PO 2101. Since the first elliptical mirror 2101 is a part of the first elliptical mirror 210 in the first example, the maximally condensed diameter Φ2101 is equal to the maximally condensed diameter Φ210 of the first elliptical mirror 210 in the first example but is less than the maximally condensed diameter Φ230 of the second elliptical mirror 230. Since, as described above, the size of the aperture of the first elliptical mirror 2101 on the side of the second focal point FP2 is defined to be equal to the size of the aperture of the second elliptical mirror 230 in the first example on the side of the second focal point FP2, the maximally condensed angle Ψ2101 is less than the maximally condensed angle Ψ230 of the second elliptical mirror 230 in the first example. Here, the maximum reflection mirror outer diameter D 2102 is the outer diameter of the first spherical mirror 2102, and thus, is greater than the maximum reflection mirror outer diameter D 230 of the second elliptical mirror 230 in the first example.

As described above, even in the conventional light source apparatus 600 in which the condenser is a two-stage structured condenser configured to include one elliptical mirror and one spherical mirror in this order, the values of the maximally condensed diameter Φ, the maximally condensed angle Ψ, and the maximum reflection mirror outer diameter D of the condenser cannot be simultaneously reduced. Note that the same applies to the conventional light source apparatus in which the condenser is a two-stage structured condenser configured to include one spherical mirror and one elliptical mirror in this order. For example, if the maximally condensed diameter Φ is reduced more than the state shown in FIG. 11C, the maximally condensed angle Ψ and the maximum reflection mirror outer diameter D are increased.

Accordingly, in the light source apparatus according to the present embodiment, a condenser including four reflection mirrors in which two elliptical mirrors and two spherical mirrors each having a rotationally symmetrical shape around the optical axis AX are alternately disposed is employed so as to simultaneously reduce the values of the maximally condensed diameter Φ, the maximally condensed angle Ψ, and the maximum reflection mirror outer diameter D of the condenser.

Figure 1:
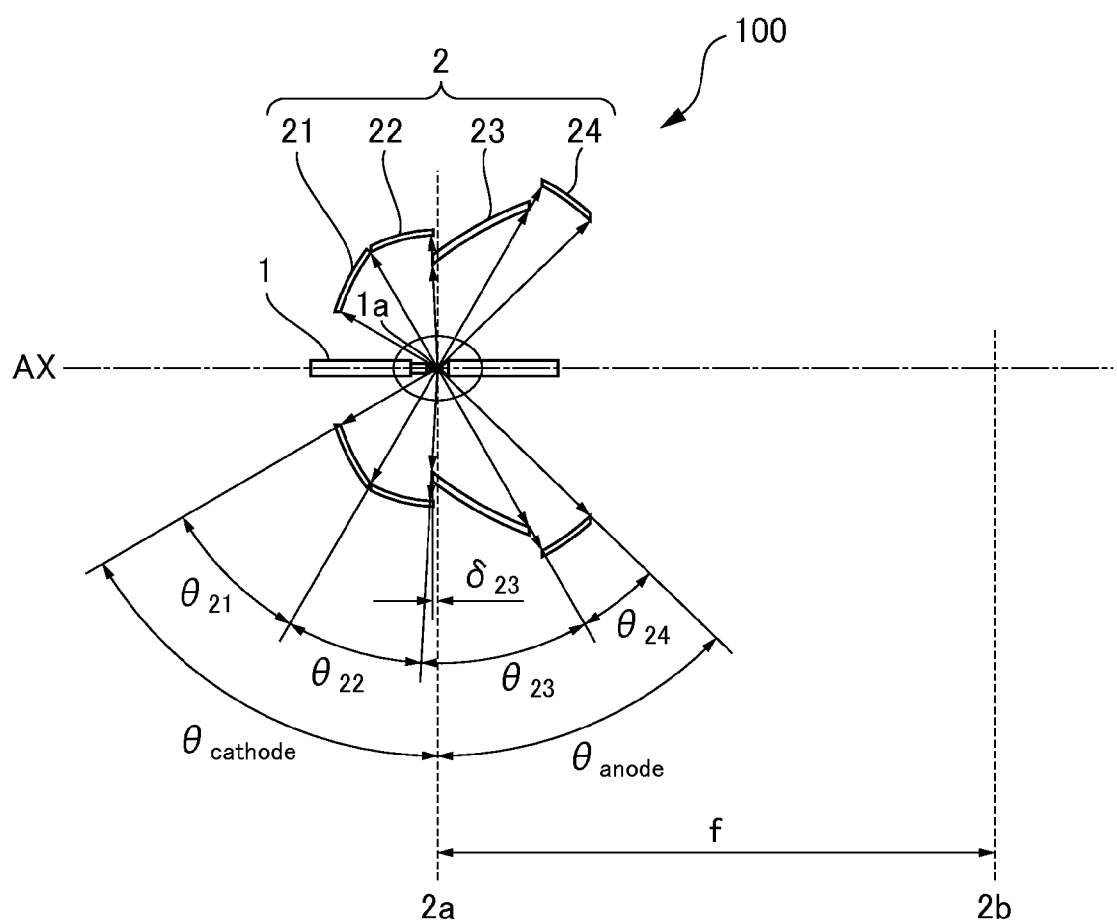
FIG. 1 is a diagram illustrating a configuration of a light source apparatus according to a first embodiment of the present invention.

FIG. 1 is a schematic cross-sectional view illustrating a configuration of a light source apparatus 100 according to the present embodiment. FIG. 1 corresponds to FIG. 11A used for description of the conventional light source apparatus 500 under the same description conditions and the like. As in the conventional light source apparatus, the light source apparatus 100 includes a light source 1 as a high pressure mercury lamp and a condenser 2 as a four-stage structured reflection mirror. Firstly, a first reflection mirror 21 and a third reflection mirror 23 are elliptical mirrors, of which the reflecting surface is elliptical, with different eccentricities, and share two focal points on the optical axis AX. Among them, the first reflection mirror 21 can be represented as a part of the conventional first elliptical mirror 210 and the third reflection mirror 23 can be represented as a part of the second elliptical mirror 230. On the other hand, a second reflection mirror 22 and a fourth reflection mirror 24 are spherical mirrors of which the reflecting surface is spherical surface, and their central points are substantially at the same position as the first focal point FP1 shared by the first reflection mirror 21 and the third reflection mirror 23.

In FIG. 1, the ranges of the angles at which the light flux is reflected by the first reflection mirror 21, the second reflection mirror 22, the third reflection mirror 23, and the fourth reflection mirror 24, respectively, are represented as θ21, θ22, θ23, and θ24, respectively. Here, it is preferable that θ21 and θ22, θ22 and θ23, and θ23 and θ24 are substantially continuous. It is also preferable that the range (θ21+θ22+θ23+θ24) of angles at which the light flux is reflected by the condenser 2 is substantially equal to the range (θcathode+θanode) of angles at which the light flux is emitted by the light source 1. It is assumed that the range of the angle θ21 (θ) at which the light flux is reflected by the first reflection mirror 21 and the range of the angle θ24 (θ') at which the light flux is reflected by the fourth reflection mirror 24 satisfy the relationship of θ21≥θ24 (θ≥θ'). On the other hand, the range of the angle θ22 (θ') at which the light flux is reflected by the second reflection mirror 22 and the range of the angle θ23 (θ) at which the light flux is reflected by the third reflection mirror 23 satisfy the relationship of θ22≤θ23. Furthermore, the third reflection mirror 23 is overhung by a distance δ23, which is determined by the spacing between the cathode and the anode of the light source 1, toward the second reflection mirror 22 across the first auxiliary line 2*a*.

Figure 2A:
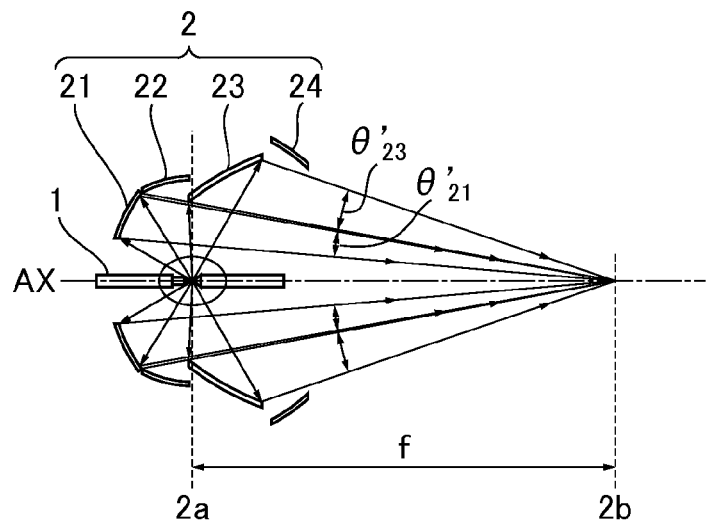
FIG. 2A is a diagram illustrating a condensed state by a condenser according to the first embodiment.
Figure 2B:
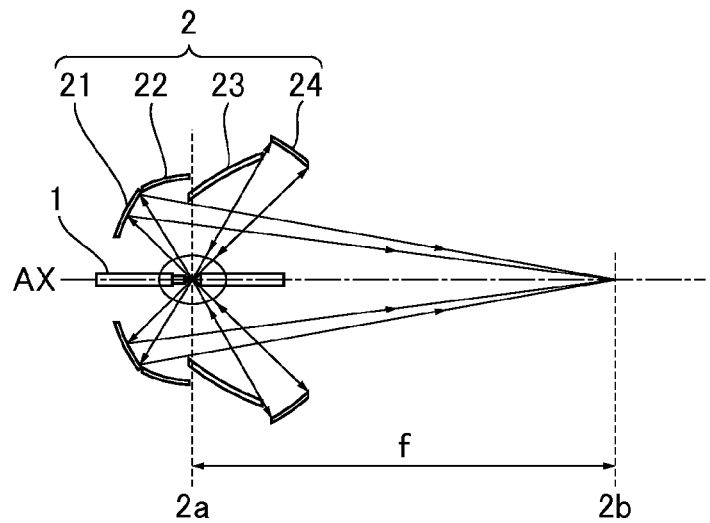
FIG. 2B is a diagram illustrating a condensed state by a condenser according to the first embodiment.
Figure 2C:
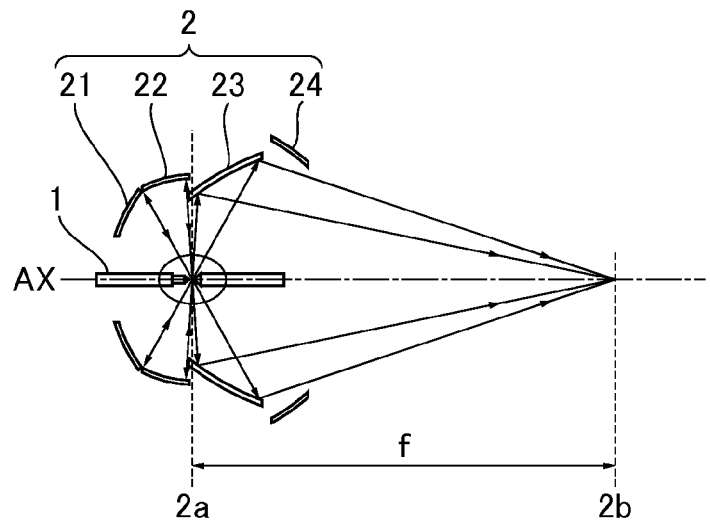
FIG. 2C is a diagram illustrating a condensed state by a condenser according to the first embodiment.

FIGS. 2A to 2C are schematic cross-sectional views illustrating a condensed state by the condenser 2 according to the configuration shown in FIG. 1. Among them, FIG. 2A is a diagram illustrating the condensed state of each of the first reflection mirror 21 and the third reflection mirror 23 which are elliptical mirrors. A portion of the light flux emitted from the light source 1 is reflected by the first reflection mirror 21, and is condensed at the second focal point with the angle θ'21. On the other hand, the other portion of the light flux emitted from the light source 1 is reflected by the third reflection mirror 23, and is condensed at the second focal point with the angle θ'23. Here, it is preferable that the angles θ'21 and θ'23 at which the light flux is condensed at the second focal point are substantially continuous.

FIG. 2B is a diagram illustrating the condensed state of the fourth reflection mirror 24 which is a spherical mirror. A portion of the light flux emitted from the light source 1 is reflected by the fourth reflection mirror 24, is returned to the vicinity of the light emitting point 1a, is reflected by the first reflection mirror 21, and then is condensed at the second focal point. Here, the reason why the relationship between the ranges of the angles θ21 and θ24 is set to θ21≥θ24 as described above is because all the light fluxes returned to the vicinity of the light emitting point 1a by the fourth reflection mirror 24 are adapted to be reflected by the first reflection mirror 21.

FIG. 2C is a diagram illustrating the condensed state of the second reflection mirror 22 which is a spherical mirror. A portion of the light flux emitted from the light source 1 is reflected by the second reflection mirror 22, is returned to the vicinity of the light emitting point 1a, is reflected by the third reflection mirror 23, and then is condensed at the second focal point. Here, the reason why the relationship between the ranges of the angles θ22 and θ23 is set to θ22≤θ23 as described above is because all the light fluxes returned to the vicinity of the light emitting point 1a by the second reflection mirror 22 are adapted to be reflected by the third reflection mirror 23.

Figure 3A:
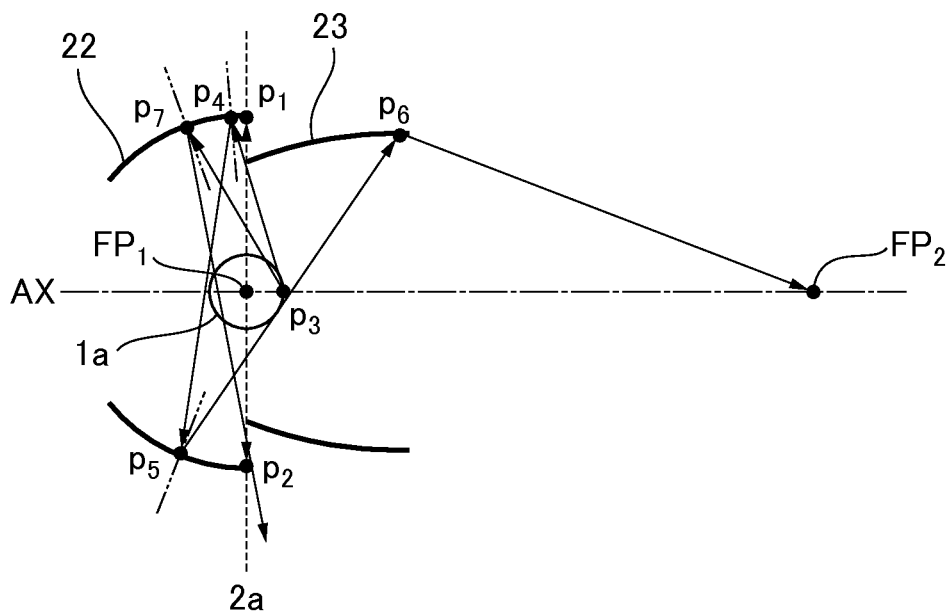
FIG. 3A is a diagram illustrating a third reflection mirror in an overhung shape according to the first embodiment.
Figure 3B:
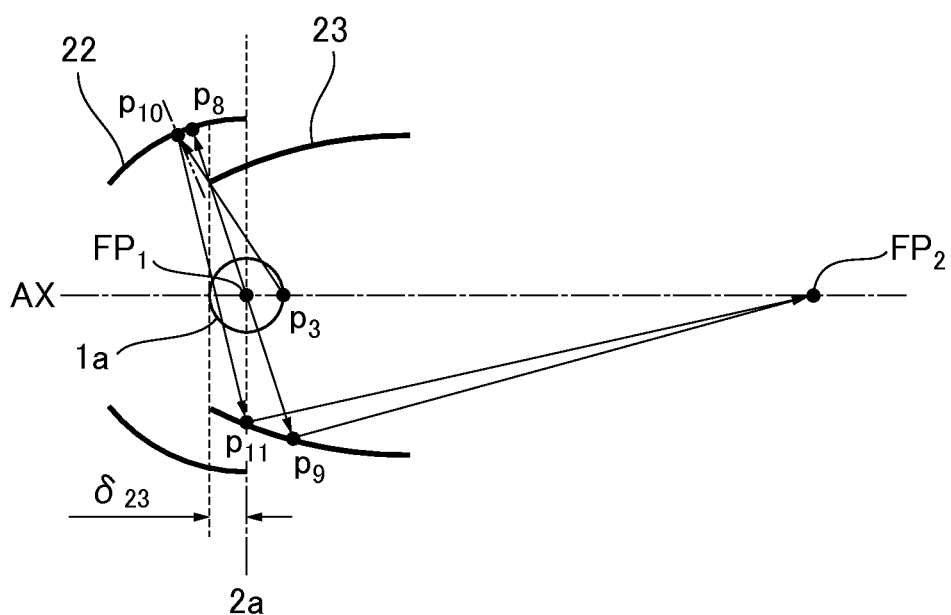
FIG. 3B is a diagram illustrating a third reflection mirror in an overhung shape according to the first embodiment.

Next, a description will be given of the reason why the third reflection mirror 23 is overhung by a distance δ23 toward the second reflection mirror 22 across the first auxiliary line 2a as described above. FIGS. 3A and 3B are schematic cross-sectional views illustrating the second reflection mirror 22 and the third reflection mirror 23 with the third reflection mirror 23 being in an overhung shape. In FIGS. 3A and 3B, the first focal point FP1, the second focal point FP2, and the points p1 to p9 are additionally provided for explanation. Here, a description will be given by focusing on light flux which has passed through the aperture end of the third reflection mirror 23 from among light fluxes emitted from the center of the light emitting point 1a.

FIG. 3A is a diagram illustrating a case where the aperture end of the third reflection mirror 23 is not overhung toward the second reflection mirror 22 across the first auxiliary line 2a as Comparative Example. Firstly, a portion of the light flux emitted from the center of the light emitting point 1a repeats multiple reflection between the reflection point p1 and the reflection point p2, which are in opposed relation with each other across the first focal point FP1, on the second reflection mirror 22, and thus, does not reach the second focal point FP2. A light flux which is a portion of the light flux emitted from the point p3 at the end of the light emitting point 1a and has passed through the vicinity of the aperture end of the third reflection mirror 23 is reflected at the reflection point p4 which is to the left of the reflection point p1 on the second reflection mirror 22 in FIG. 3A, and then is reflected again at the reflection point p5 on the second reflection mirror 22. A light flux reflected at the reflection point p5 is reflected at the reflection point p6 on the third reflection mirror 23 in a state where the light flux is lowered in light intensity by the amount of one extra reflection from the second reflection mirror 22, and then reaches the second focal point FP2. A light flux which is a portion of the light flux emitted from the point p3 at the end of the light emitting point 1a and has been reflected at the reflection point p7 which is to the left of the reflection point p4 on the second reflection mirror 22 in FIG. 3A is externally dissipated by passing through the boundary between the second reflection mirror 22 and the third reflection mirror 23, and thus, does not reach the second focal point FP2. Furthermore, a light flux (not shown) which is a portion of the light flux emitted from the point p3 at the end of the light emitting point 1a and has been reflected at the point which is to the left of the reflection point p7 on the second reflection mirror 22 in FIG. 3A is reflected by the third reflection mirror 23, and then reaches the second focal point FP2. As described above, if no overhang is provided with the third reflection mirror 23, a light flux which does not reach the second focal point FP2 and a light flux which reaches the second focal point FP2 with the light flux being lowered in light intensity due to two times reflection by the second reflection mirror 22 are present in a portion of the light flux emitted from the light emitting point 1a.

FIG. 3B is a diagram illustrating a case where the aperture end of the third reflection mirror 23 is overhung by the distance δ23 toward the second reflection mirror 22 across the first auxiliary line 2a in the present embodiment. Firstly, a portion of the light flux emitted from the center of the light emitting point 1a is reflected at the reflection point p8 on the second reflection mirror 22, and then is reflected at the reflection point p9, which is in opposed relation with the reflection point p8 across the first focal point FP1, on the third reflection mirror 23 to thereby reach the second focal point FP2. A light flux which is a portion of the light flux emitted from the point p3 at the end of the light emitting point 1a and has passed through the vicinity of the aperture end of the third reflection mirror 23 is reflected at the reflection point p10 which is to the left of the reflection point p8 on the second reflection mirror 22 in FIG. 3B, and then is reflected at the reflection point p11 on the third reflection mirror 23 to thereby reach the second focal point FP2. As described above, if an overhang is provided with the third reflection mirror 23, a light flux which does not reach the second focal point FP2 and a light flux which reaches the second focal point FP2 with the light flux being lowered in light intensity due to two times reflection by the second reflection mirror 22 can be eliminated from the light flux emitted from the light emitting point 1a. Note that the diameter of the light emitting point 1a of the light source 1 is substantially equal to the distance between the cathode and the anode of the light source 1 in which the light emitting point 1a is formed. Accordingly, it is preferable that the value of δ23 is ½ or greater than the distance between the cathode and the anode of the light source 1.

Figure 4:
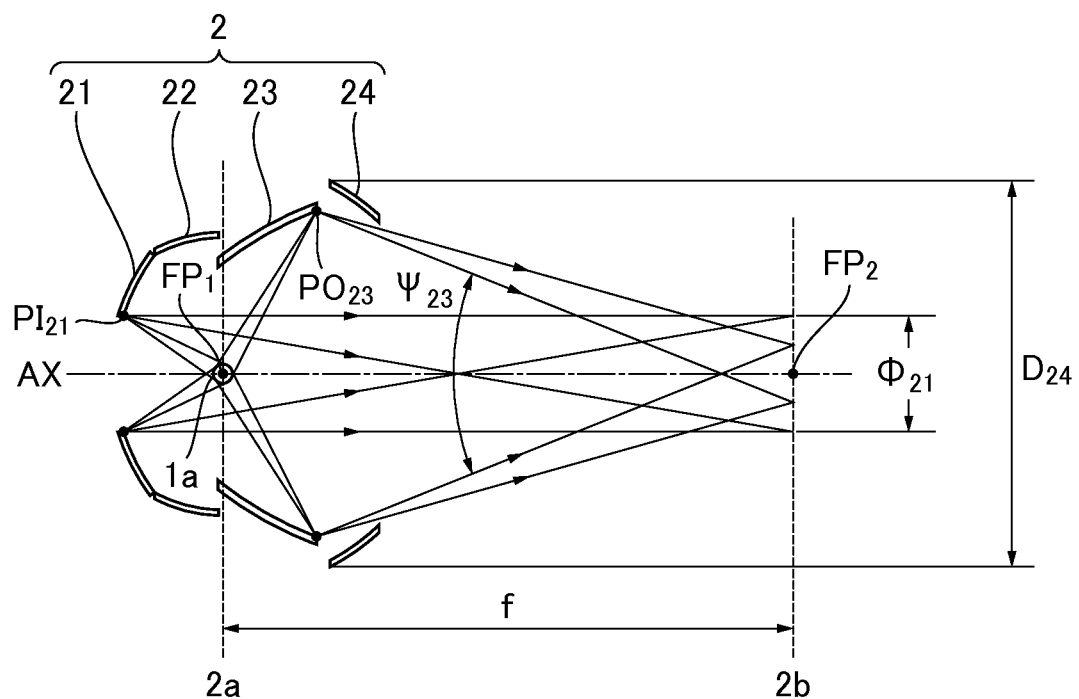
FIG. 4 is a diagram illustrating the maximally condensed diameter or the like of the condenser according to the first embodiment.

Next, a description will be given of the maximally condensed diameter Φ, the maximally condensed angle Ψ, and the maximum reflection mirror outer diameter D in the light source apparatus 100. FIG. 4 is a diagram illustrating the maximally condensed diameter Φ21 and the maximally condensed angle Ψ23 of the light flux condensed by the condenser 2 and the maximum reflection mirror outer diameter D24 of the condenser 2. Note that FIG. 4 corresponds to FIG. 11B used for description of the conventional light source apparatus 500 under the same description conditions and the like. FIG. 4 is also a simplified representation of a general view of the light source 1, shows a condensed state of a light beam emitted from the outermost periphery of the light emitting point 1a having a predetermined size, and explicitly shows the first focal point FP1, the second focal point FP2, the reflection point PI 21, and the reflection point PO 23. Firstly, since the first reflection mirror 21 can be represented as a part of the conventional first elliptical mirror 210, the maximally condensed diameter Φ21 is equal to the conventional maximally condensed diameter Φ210 of the first elliptical mirror 210 but is less than the conventional maximally condensed diameter Φ230 of the second elliptical mirror 230. Since the size of the aperture of the third reflection mirror 23 on the side of the second focal point FP2 is less than that of the aperture of the conventional second elliptical mirror 230 on the side of the second focal point FP2 by the amount corresponding to the provision of the fourth reflection mirror 24, the maximally condensed angle Ψ23 is less than the conventional maximally condensed angle Ψ230 of the second elliptical mirror 230. The maximum reflection mirror outer diameter D24 is the outer diameter of the fourth reflection mirror 24. By adjusting the position of the boundary between the fourth reflection mirror 24 and the third reflection mirror 23, the outer diameter of the fourth reflection mirror 24 can be substantially the same as the maximum reflection mirror outer diameter D230 of the conventional second elliptical mirror 230. Thus, the maximum reflection mirror outer diameter D24 can be substantially the same as the conventional maximum reflection mirror outer diameter D230.

As described above, the light source apparatus 100 is configured such that the condenser 2 is a four-stage structured reflection mirror as described above, so that the light flux emitted from the light source 1 can be condensed at the second focal point FP2 of the condenser 2. At this time, the light source apparatus 100 can simultaneously reduce the maximally condensed diameter Φ, the maximally condensed angle Ψ and the maximum reflection mirror outer diameter D of the condenser 2 to be equal or less than those obtained by the conventional light source apparatus 500 shown in FIG. 11C. Specifically, the light source apparatus 100 can efficiently utilize the light flux emitted from the light source 1 while maintaining the overall size of the condenser 2.

As described above, according to the present embodiment, a light source apparatus that is advantageous in terms of the utilization efficiency of light flux emitted from a light source may be provided.

(Second Embodiment)

Next, a description will be given of a light source apparatus according to a second embodiment of the present invention. While a four-stage structured condenser in which two elliptical mirrors and two spherical mirrors each having a rotationally symmetrical shape around the optical axis AX are alternately disposed is employed in the light source apparatus 100 according to the first embodiment, the present invention is not limited thereto but a condenser having four or more reflection mirrors may also be employed. In the present embodiment, a description will be given of a light source apparatus employing a six-stage structured condenser in which three elliptical mirrors and three spherical mirrors each having a rotationally symmetrical shape around the optical axis AX are alternately disposed.

Figure 5A:
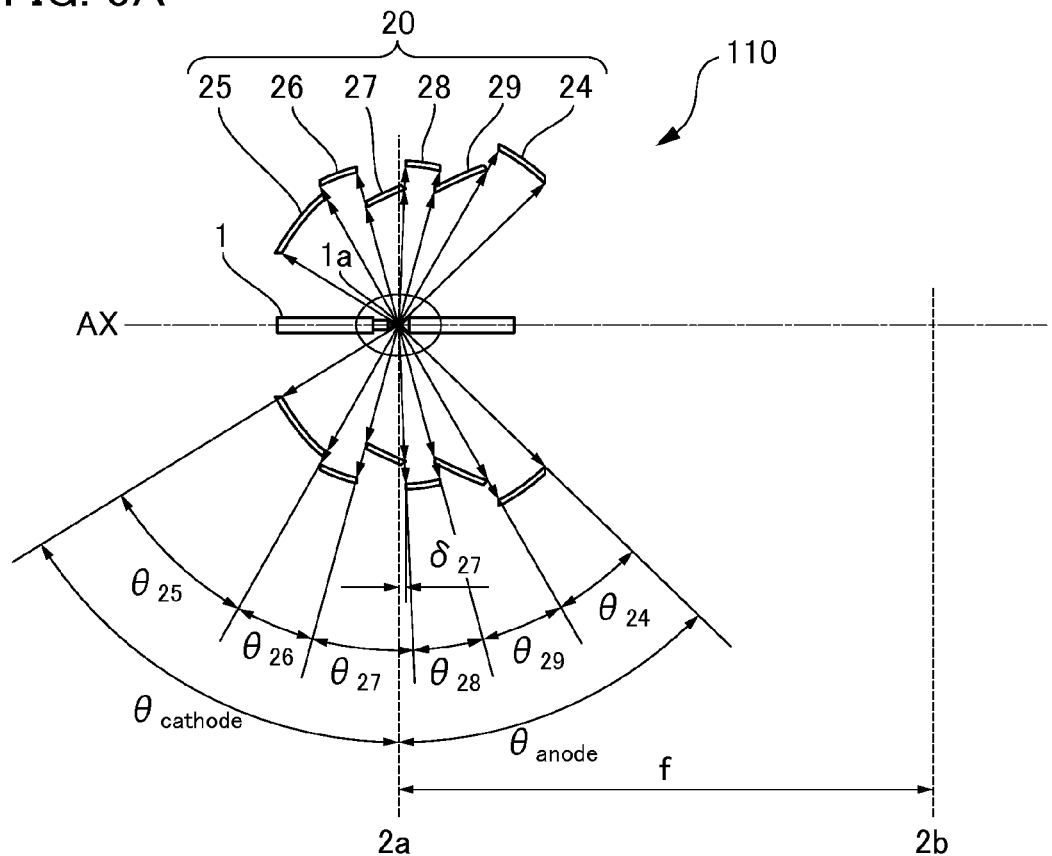
FIG. 5A is a diagram illustrating a configuration of a light source apparatus according to a second embodiment of the present invention.
Figure 5B:
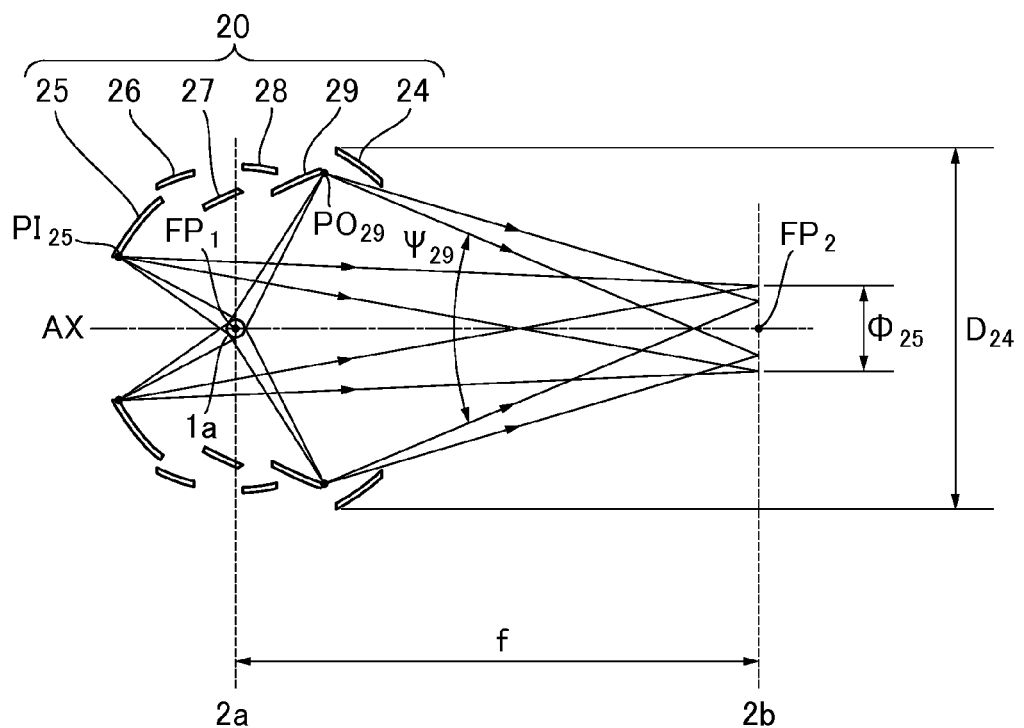
FIG. 5B is a diagram illustrating a configuration of a light source apparatus according to the second embodiment of the present invention.

FIGS. 5A and 5B are schematic cross-sectional views illustrating a configuration of a light source apparatus 110 according to the present embodiment. As in the conventional light source apparatus, the light source apparatus 110 includes a light source 1 as a high pressure mercury lamp and a condenser 20 as a six-stage structured condenser. FIG. 5A is a view corresponding to FIG. 11A used for description of the conventional light source apparatus 500 under the same description conditions and the like. Firstly, a first reflection mirror 25, a third reflection mirror 27, and a fifth reflection mirror 29 are elliptical mirrors with different eccentricities, and share two focal points on the optical axis AX. The eccentricity of the first reflection mirror 25 is less than that of the third reflection mirror 23, and the eccentricity of the third reflection mirror 23 is less than that of the fifth reflection mirror 29. Among them, the fifth reflection mirror 29 can be represented as a part of the third reflection mirror 27 in the first embodiment, and thus, the size of the aperture diameter of the fifth reflection mirror 29 on the side of the second focal point FP2 is the same as that of the aperture diameter of the third reflection mirror 23. On the other hand, a second reflection mirror 26, a fourth reflection mirror 28, and a sixth reflection mirror 24 are spherical mirrors, and their central points are substantially at the same position as the first focal point FP1 shared by the first reflection mirror 21, the third reflection mirror 23, and the fifth reflection mirror 29. Among them, the sixth reflection mirror 24 is the same spherical mirror as the fourth reflection mirror 24 in the first embodiment.

In FIG. 5A, the ranges of the angles at which the light flux is reflected by the first reflection mirror 25, the second reflection mirror 26, the third reflection mirror 27, the fourth reflection mirror 28, the fifth reflection mirror 29, and the sixth reflection mirror 24, respectively, are represented as θ25, θ26, θ27, θ28, θ29, and θ24, respectively. Here, it is preferable that θ25 and θ26, θ26 and θ27, θ27 and θ28, θ28 and θ29, and θ29 and θ24 are substantially continuous. It is also preferable that the range (Σθ25 to θ29+θ24) of angles at which the light flux is reflected by the condenser 20 is substantially equal to the range (θcathode+θanode) of angles at which the light flux is emitted by the light source 1. As has been described in the first embodiment, it is preferable that the spherical mirror and the elliptical mirror for reflecting the light flux which has been reflected thereby satisfy the relationship of (the angle θ at which the light flux is reflected by the elliptical mirror)≥(the angle θ' at which the light flux is reflected by the spherical mirror). For example, the range of the angle θ25 at which the light flux is reflected by the first reflection mirror 25 and the range of the angle θ24 at which the light flux is reflected by the sixth reflection mirror 24 satisfy the relationship of θ25≥θ24. The range of the angle θ25 at which the light flux is reflected by the second reflection mirror 26 and the range of the angle θ29 at which the light flux is reflected by the fifth reflection mirror 29 satisfy the relationship of θ29≥θ26. The range of the angle θ27 at which the light flux is reflected by the third reflection mirror 27 and the range of the angle θ28 at which the light flux is reflected by the fourth reflection mirror 28 satisfy the relationship of θ27≥θ28. Furthermore, the third reflection mirror 27 is overhung by a distance δ27, which is determined by the spacing between the cathode and the anode of the light source 1, toward the fourth reflection mirror 28 across the first auxiliary line 2a.

In the present embodiment, the reflection path of the elliptical mirror and the reflection path of the elliptical mirror via the spherical mirror are the same as those in the light source apparatus 100 according to the first embodiment, and explanation thereof will be omitted.

Next, a description will be given of the maximally condensed diameter Φ, the maximally condensed angle Ψ, and the maximum reflection mirror outer diameter D of the condenser 20. FIG. 5B is a diagram illustrating the maximally condensed diameter Φ25 and the maximally condensed angle Ψ29 of the light flux condensed by the condenser 20 and the maximum reflection mirror outer diameter D24 of the condenser 20. Note that FIG. 5B corresponds to FIG. 11B used for description of the conventional light source apparatus 500 under the same description conditions and the like. FIG. 4 is also a simplified representation of a general view of the light source 1, shows a condensed state of a light beam emitted from the outermost periphery of the light emitting point 1a having a predetermined size, and explicitly shows the first focal point FP1, the second focal point FP2, a reflection point PI 25, and a reflection point PO 29. Firstly, the sixth reflection mirror 24 is the same as the fourth reflection mirror 24 in the first embodiment, and thus, the maximum reflection mirror outer diameter D24 is equal to the maximum reflection mirror outer diameter D24 in the first embodiment. The fifth reflection mirror 29 can be represented as a part of the third reflection mirror 23 in the first embodiment which is the elliptical mirror and has the same aperture diameter as that of the third reflection mirror 23 on the side of the second focal point FP2, and thus, the maximally condensed angle Ψ29 is equal to the maximally condensed angle Ψ23 in the first embodiment. The eccentricity of the first reflection mirror 25 is less than that of the first reflection mirror 21 in the first embodiment, and thus, the distance between the reflection point PI 25 on the first reflection mirror 25 and the light emitting point 1a is greater than that between the reflection point PI 21 on the first reflection mirror 21 in the first embodiment and the light emitting point 1a. Thus, the maximally condensed diameter Φ25 is less than the maximally condensed diameter Φ21 in the first embodiment.

The light source apparatus 110 is configured such that a condenser is a six-stage structure as described above, so that the maximally condensed angle Φ and the maximum reflection mirror outer diameter D of the condenser are the same but the maximally condensed diameter Ψ of the condenser can be reduced as compared with the four-stage structured condenser in the first embodiment. While the condenser is a six-stage structure in the present embodiment, in the light source apparatus of the present invention, the maximally condensed diameter Ψ of the condenser can be reduced while maintaining the maximally condensed angle Φ and the maximum reflection mirror outer diameter D of the condenser by increasing the number of stages of the condenser to an even number such as eight or ten. Consequently, the same effects as in the first embodiment may be provided according to the present embodiment.

(Third Embodiment)

Next, a description will be given of a light source apparatus according to a third embodiment of the present invention. In the light source apparatus 100 and 110 according to the above embodiments, the condenser is configured for even number stages consisting of an elliptical mirror(s) and a spherical mirror(s). In contrast, the characteristic of the light source apparatus according to the present embodiment lies in the fact that the condenser having an odd number of stages in which elliptical mirrors and spherical mirrors each having a rotationally symmetrical shape around the optical axis AX are alternately disposed is employed.

Figure 6:
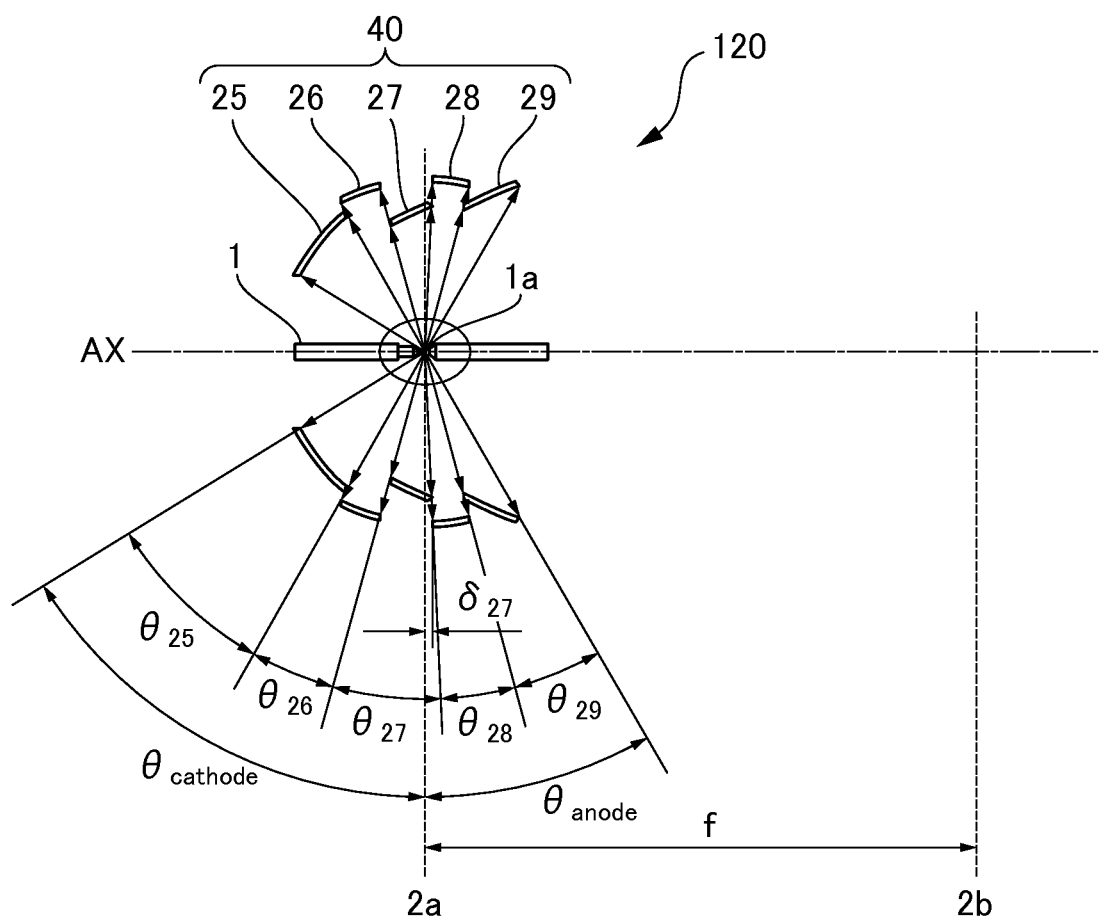
FIG. 6 is a diagram illustrating a configuration of a light source apparatus according to a third embodiment of the present invention.

FIG. 6 is a schematic cross-sectional view illustrating a configuration of a light source apparatus 120 according to the present embodiment. Note that FIG. 6 corresponds to FIG. 11A used for description of the conventional light source apparatus 500 under the same description conditions and the like. As in the conventional light source apparatus, the light source apparatus 120 includes a light source 1 as a high pressure mercury lamp and a condenser 40 as a five-stage structured condenser by way of example. As described above, the condition available even when the condenser is configured to have an odd number of stages depends on the radiation angle of the light flux emitted by the light source 1. More specifically, the light source 1 which may be applicable in this case is such that the radiation angle θanode of the light flux emitted by the light source 1 is less than the radiation angle θanode of the light flux emitted by the light source 1 in the second embodiment shown in FIGS. 5A and 5B. The condenser 40 is configured such that the sixth reflection mirror 24 serving as a spherical mirror is excluded from the condenser 20 shown in FIGS. 5A and 5B in accordance with the light source 1 in this case. The light source apparatus 120 provides the same effects as in the above embodiments even if the condenser is configured to have an odd number of stages as described above.

(Fourth Embodiment)

Next, a description will be given of a light source apparatus according to a fourth embodiment of the present invention. As can be seen by referencing FIG. 1, in the light source apparatus 100 according to the first embodiment, the radiation angle θcathode of the light flux emitted from the cathode side of the light source 1 and the radiation angle θanode of the light flux emitted from the anode side of the light source 1 are in the relationship of θcathode>θanode. In contrast, the characteristic of the light source apparatus according to the present embodiment lies in the fact that the condenser is set such that θcathode becomes equal to θanode (θcathode=θanode).

Figure 7A:
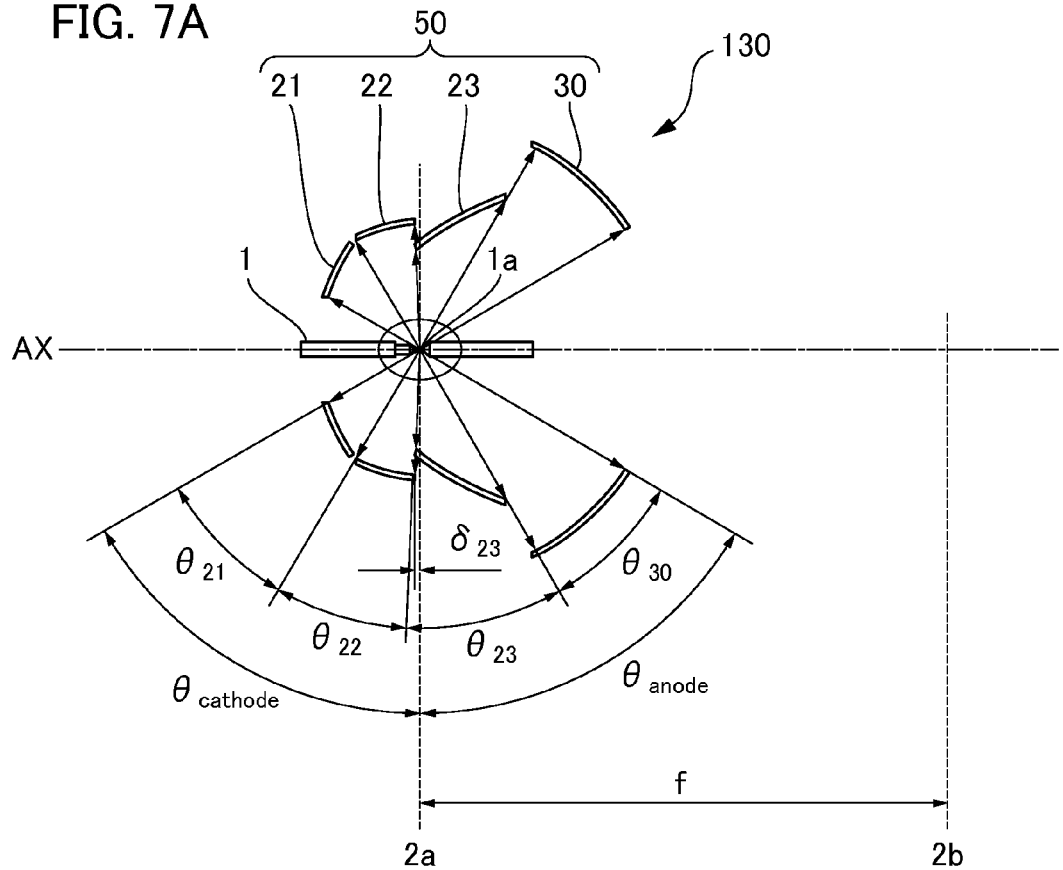
FIG. 7A is a diagram illustrating a configuration of a light source apparatus according to a fourth embodiment of the present invention.
Figure 7B:
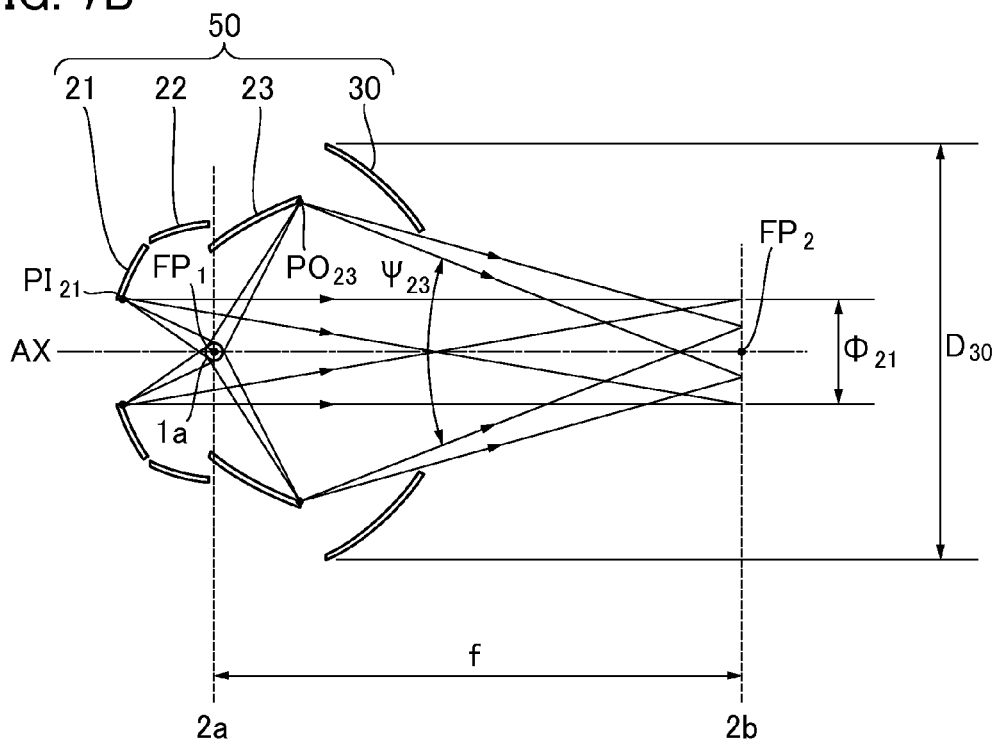
FIG. 7B is a diagram illustrating a configuration of a light source apparatus according to the fourth embodiment of the present invention.

FIGS. 7A and 7B are schematic cross-sectional views illustrating a configuration of a light source apparatus 130 according to the present embodiment. As in the conventional light source apparatus, the light source apparatus 130 includes a light source 1 as a high pressure mercury lamp and a condenser 50 as a four-stage structured condenser as in the first embodiment. FIG. 7A is a view corresponding to the light source apparatus 100 shown in FIG. 1 according to the first embodiment under the same description conditions and the like. In the present embodiment, θanode is increased to be equal to θcathode, for example, by changing the tip profile in the vicinity of the light emitting point 1a on the anode. As described above, the light flux from the light emitting point 1a, which has been previously shielded due to the shape of the anode, can be emitted to the outside of the light source 1 by changing the tip profile in the vicinity of the light emitting point 1a on the anode, resulting in an increase in the light output of the light source 1. The condenser 50 is configured such that it is the same as the condenser 2 of the light source apparatus 100 according to the first embodiment from the first reflection mirror 21 to the third reflection mirror 23 but the area for reflecting the light flux from a fourth reflection mirror 30 is extended in correspondence of an increase in θanode.

Also, in the present embodiment, the reflection path of the elliptical mirror and the reflection path of the elliptical mirror via the spherical mirror are the same as those in the light source apparatus 100 according to the first embodiment, and explanation thereof will be omitted.

Next, a description will be given of the maximally condensed diameter Φ, the maximally condensed angle Ψ, and the maximum reflection mirror outer diameter D of the condenser 50. FIG. 7B is a diagram illustrating the maximally condensed diameter Φ21 and the maximally condensed angle Ψ23 of the light flux condensed by the condenser 50 and the maximum reflection mirror outer diameter D30 of the condenser 50. Note that FIG. 7B corresponds to FIG. 4 used for description of the light source apparatus 100 according to the first embodiment under the same description conditions and the like. FIG. 4 is also a simplified representation of a general view of the light source 1, shows a condensed state of a light beam emitted from the outermost periphery of the light emitting point 1a having a predetermined size, and explicitly shows the first focal point FP1, the second focal point FP2, the reflection point PI 21, and the reflection point PO 23. Here, the condenser 50 is the same as the condenser 2 of the light source apparatus 100 according to the first embodiment as described above except for changing only the fourth reflection mirror 30. Thus, the maximally condensed diameter Φ21 and the maximally condensed angle Ψ23 are the same as the maximally condensed diameter Φ21 and the maximally condensed angle Ψ23, respectively, shown in FIG. 2A, and the maximum reflection mirror outer diameter D30 is greater than the maximum reflection mirror outer diameter D24 shown in FIG. 2A. Specifically, according to the present embodiment, the light source apparatus 130 can be configured such that, in the light source 1 of which the light output is increased with an increase in θanode, only the end mirror (the fourth reflection mirror 30) on the side of the second focal point FP2 is increased in size without changing the maximally condensed diameter Φ and the maximally condensed angle Ψ.

(Illumination Device)

Next, a description will be given of an illumination device according to one embodiment of the present invention. The illumination device according to the present embodiment includes the light source apparatus according to the above embodiments and outputs the light flux emitted from the light source apparatus to a predetermined position (area). In particular, the characteristic of the illumination device according to the present embodiment lies in the fact that the maximally condensed diameter of the condenser 2 is about the same as that of the condenser in the conventional light source apparatus in spite of a further increase in size of the light emitting point 1a of the light source 1.

Figure 8A:
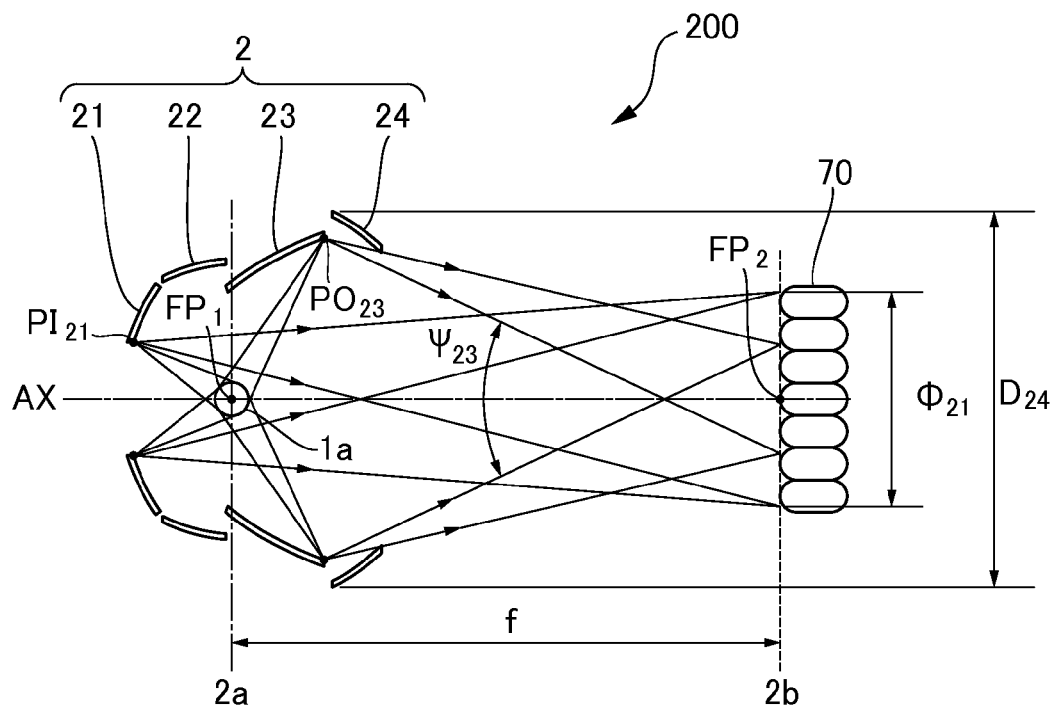
FIG. 8A is a diagram illustrating a configuration of an illumination device according to one embodiment of the present invention.
Figure 8B:
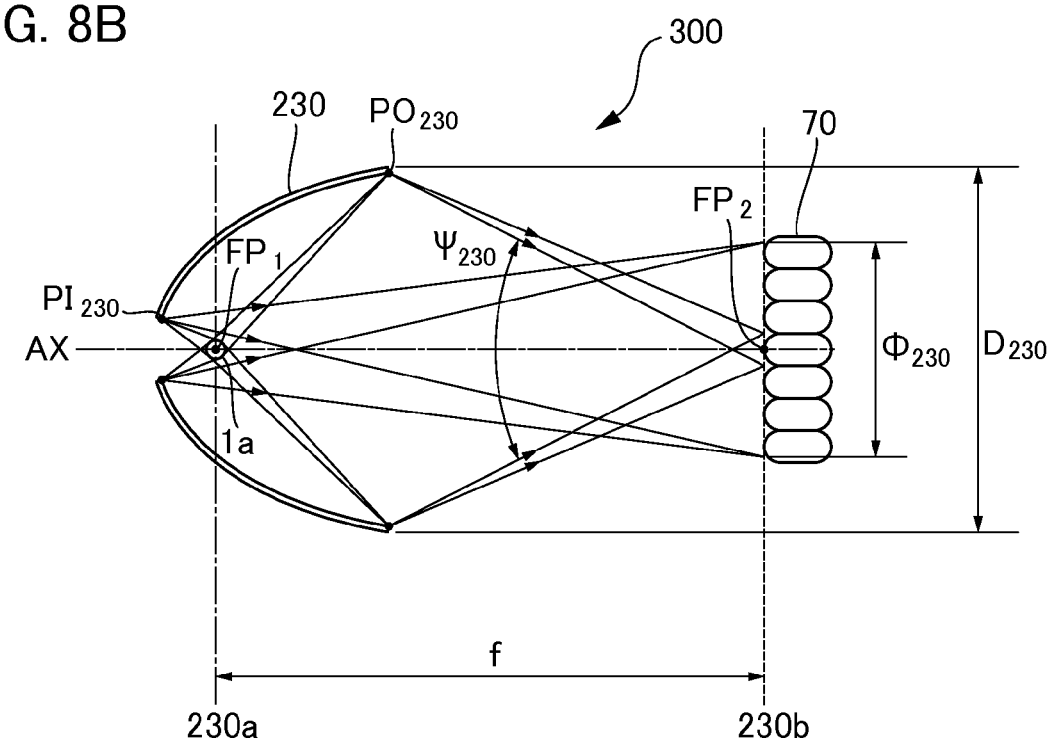
FIG. 8B is a diagram illustrating a configuration of an illumination device according to one embodiment of the present invention.

FIGS. 8A and 8B are schematic cross-sectional views illustrating a configuration of an illumination device. Among them, FIG. 8A is a view illustrating an illumination device 200 according to the present embodiment, where the illumination device 200 is the light source apparatus 100 according to the first embodiment additionally provided with an optical integrator 70 and the light emitting point 1a of the light source 1 is larger than the light emitting point 1a shown in FIG. 4. On the other hand, FIG. 8B is a view illustrating a conventional illumination device 300 as Comparative Example, where the conventional illumination device 300 is the conventional light source apparatus 500 additionally provided with the optical integrator 70. Although it is often the case where an image-forming optical system is typically provided between the second focal point FP2 of the condenser and the incident surface of the optical integrator 70, the description of the image-forming optical system is omitted for simplicity, and thus, the incident surface of the optical integrator 70 is directly disposed at the second focal point FP2 of the condenser. The light flux which has passed through the optical integrator 70 reaches the illumination target surface of the illumination device. Hereinafter, a description will be given of the projection magnification of the maximally condensed diameter Φ formed by each of the light source apparatus 100 and 500 based on the assumption that the size of the light flux condensed on the incident surface of the optical integrator 70 is equal in both FIGS. 8A and 8B.

Firstly, referring to FIG. 8A illustrating the illumination device 200 according to the present embodiment, the light flux forming the maximally condensed diameter Φ21 is the one that is emitted from the light emitting point 1a and then is reflected at the reflection point PI 21 on the first reflection mirror 21. Here, if the distance between two focal points f is 1,000 mm and the eccentricity of the first reflection mirror 21 is 0.77, the segment PI21FP1 is 172 mm and the segment PI21FP2 is 1,030 mm. Specifically, the length of the segment PI21FP2 is 6 times as long as the segment PI21FP1 and an image of the light emitting point 1a is projected in enlargement of 6 times onto the incident surface of the optical integrator 70. Thus, it can be said that the size of the light emitting point 1a in this case is ⅙ of the maximally condensed diameter Φ21 which is the size of the light flux condensed on the incident surface of the optical integrator 70.

In contrast, referring to FIG. 8B illustrating the conventional illumination device 300, the light flux forming the maximally condensed diameter Φ230 is the one that is emitted from the light emitting point 1a and then is reflected at the reflection point PI 230 on the first reflection mirror 23. Here, if the distance between two focal points f is 1,000 mm and the eccentricity of the first reflection mirror 21 is 0.85, the segment PI230FP1 is 102 mm and the segment PI230FP2 is 1017 mm. Specifically, the length of the segment PI230FP2 is 10 times as long as the segment PI230FP1 and an image of the light emitting point 1a is projected in enlargement of 10 times onto the incident surface of the optical integrator 70. Thus, it can be said that the size of the light emitting point 1a in this case is 1/10 of the maximally condensed diameter Φ230 which is the size of the light flux condensed on the incident surface of the optical integrator 70.

Specifically, the size of the light emitting point 1a in the illumination device 200 according to the present embodiment is about 1.7 times as large as the size of the light emitting point 1a in the conventional illumination device 300. In general, it is contemplated that the size of the light emitting point of the light source (high pressure mercury lamp) is proportional to the distance between the cathode and the anode. It is also contemplated that the output of the light source used in the illumination device is in approximately proportional relationship with the distance between the cathode and the anode. Thus, when the size of the light emitting point is increased by 1.7 times, the output of the light source used in the illumination device is also increased by 1.7 times. In other words, the same effect as the use of a large-output light source of which the light output is about 1.7 times as compared with that of the conventional light source may be provided by using the light source apparatus 100 according to the first embodiment as the illumination device 200, resulting in an increase in the illuminance of the illumination device by 1.7 times as that of the conventional illumination device. Furthermore, the maximally condensed angle of the light source apparatus 100 applied in the illumination device 200 is less than the condensed angle of the conventional light source apparatus 500, so that the diameter of the optical system (not shown) which may be disposed at the rear flow side of the optical integrator 70 can be set to be small.

As described above, according to the illumination device according to the present embodiment, the diameter of the optical system provided in the illumination device can be reduced to reduce the size of the overall shape and the illuminance can be improved than hitherto by using the light source apparatus according to the above embodiment.

(Exposure Apparatus)

Figure 9:
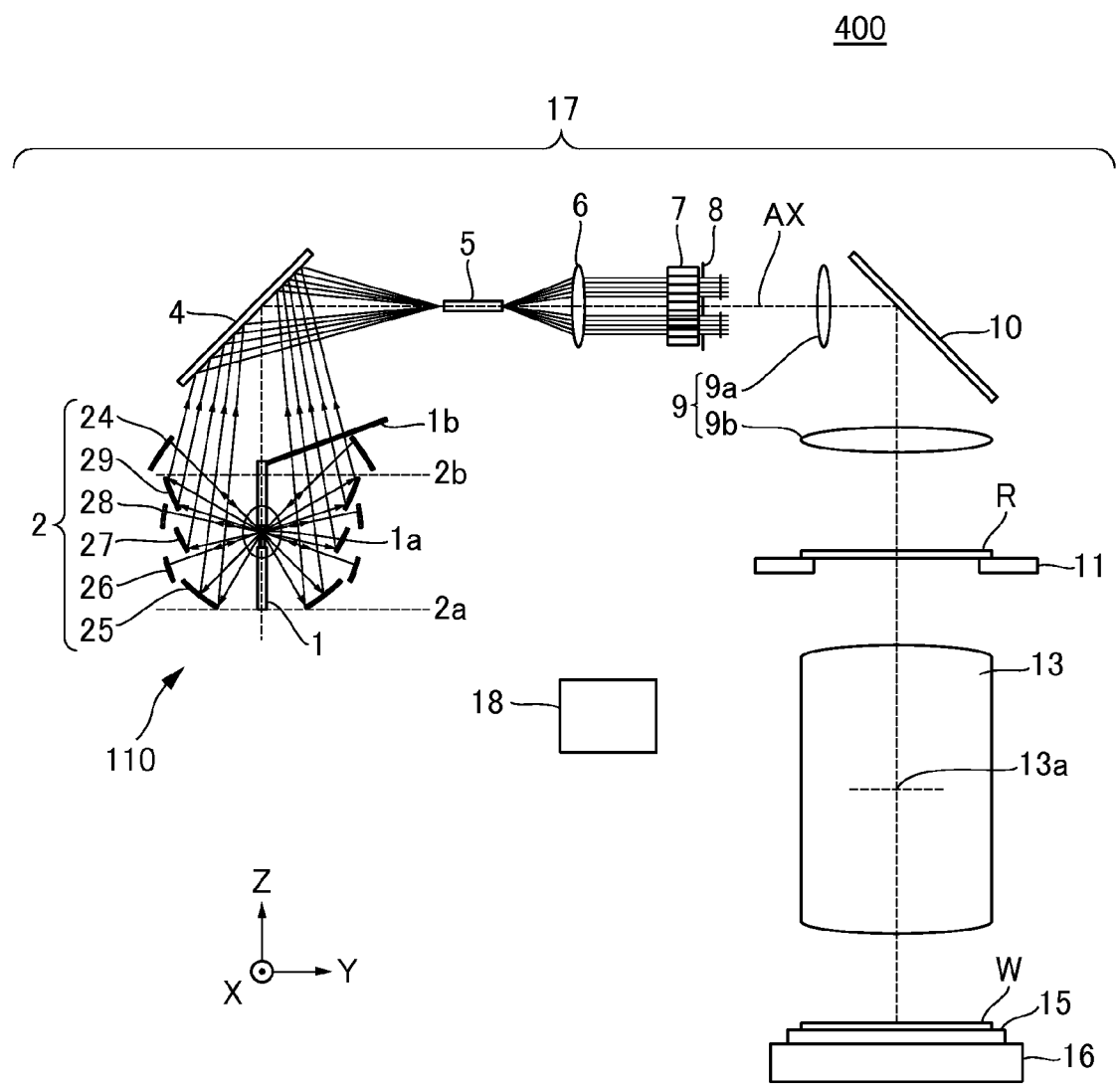
FIG. 9 is a diagram illustrating a configuration of an exposure apparatus according to one embodiment of the present invention.

Next, a description will be given of an exposure apparatus according to one embodiment of the present invention. The exposure apparatus according to the present embodiment is intended to include the light source apparatus according to the above embodiments. Hereinafter, the exposure apparatus is intended to include, by way of example, the light source apparatus 110 according to the second embodiment. FIG. 9 is a schematic view illustrating a configuration of an exposure apparatus 400 according to the present embodiment. The exposure apparatus 400 is used in, for example, a lithography step included in manufacturing steps of semiconductor devices to expose (transfer) an image of a pattern formed on a reticle R onto a wafer W (onto a substrate) by a scanning exposure system. In FIG. 9, the Z axis is aligned parallel to the optical axis of a projection optical system 13, the X axis is aligned in the scanning direction of the wafer W upon exposure within the same plane perpendicular to the Z axis, and the Y axis is aligned in the non-scanning direction orthogonal to the X axis. The exposure apparatus 400 includes an illumination system 17, a reticle stage 11, a projection optical system 13, a wafer stage 16, and a controller 18.

The illumination system 17 illuminates the reticle R by adjusting light (light flux) emitted from the light source 1. The illumination system 17 includes a light source apparatus 110 which includes a light source 1, a cold mirror 4, an optical rod 5, a Fourier transform optical system 6, an optical integrator 7, an aperture stop 8, a collimator 9, and a fold mirror 10. In the light source apparatus 110, the light flux emitted from the light source 1 is condensed by the condenser 2 and then is reflected by the cold mirror 4 to form an image of the light emitting portion 1a of the light source 1 on the incident surface of the optical rod 5 positioned in the vicinity of the second focal point FP2 of the condenser 2. The cold mirror 4 is a reflection mirror having a multilayer such as a dielectric or the like on the surface thereof. The cold mirror 4 mainly transmits infrared light and reflects ultraviolet light used as exposure light. The optical rod 5 is a light waveguide of which the lateral surface has a cylindrical shape and is disposed to prevent the occurrence of a shadow of a lead wire 1b, which supplies power to the light source 1 positioned in the vicinity of an aperture plane (plane on which the second focal point FP2 is present) 2b of the condenser 2, on the incident surface of the optical integrator 7. The light flux incident on the optical rod 5 becomes a skew light beam which swivels by being reflected by the cylindrical lateral surfaces, so that the shadow of the lead wire 1b is blurred and lost. The Fourier transform optical system (optical system) 6 receives the light flux from the output end of the optical rod 5 and converts the light flux into a collimated light flux so as to form an image of the aperture plane 2b of the condenser 2 on the incident surface of the optical integrator 7. The optical integrator 7 consists of a plurality of lenslets arrayed in a two-dimensional manner and forms a secondary light source on its exiting surface. The aperture stop 8 is detachably disposed on the exiting surface of the optical integrator 7 and shields a part of an image of a secondary light source formed on the exiting surface of the optical integrator 7 so as to shape the image of the secondary light source. For example, when the cross-section of each lenslet constituting the optical integrator 7 is rectangular, the size of an image of the secondary light source formed on the exiting surface of the optical integrator 7 differs in the XZ-plane. Accordingly, the aperture stop 8 may shape the size of an image of the secondary light source formed on the exiting surface of the optical integrator 7 to be equalized in the XZ-plane. The collimator 9 includes two lens systems 9a and 9b which are disposed with the fold mirror 10 sandwiched therebetween so as to illuminate the reticle R serving as an illumination target surface placed on the reticle stage 11.

The reticle R (or mask) is, for example, an original made of quartz glass, where a pattern to be transferred (e.g., circuit pattern) is formed on the wafer W. The reticle stage 11 is movable in both the X-axis and Y-axis directions while holding the reticle R. The projection optical system 13 projects light which has passed through the reticle R onto the wafer W at a predetermined magnification (e.g., ½). In the present embodiment, it is assumed that an image of the secondary light source formed on the exiting surface of the optical integrator 7 is formed in the vicinity of the pupil plane 13a of the projection optical system 13 by the collimator 9. The wafer W is a substrate made of single crystal silicon. A resist (photoresist) is coated on the surface thereof. The wafer stage 16 is movable in the X-axis, Y-axis, and Z-axis directions (ωx, ωy, and ωz directions which are rotational directions about the x-, y- and z-axes, respectively, may also be included) while holding the wafer W via the wafer chuck 15. The controller 18 is constituted, for example, by a computer or the like and is connected to the components of the exposure apparatus 400 via a line to thereby integrate the operation of the components in accordance with a program or the like. Note that the controller 18 may be integrated with the rest of the exposure apparatus 400 (provided in a shared housing) or may also be provided separately from the rest of the exposure apparatus 400 (provided in a separate housing).

Next, a description will be given of the case where a detachable light flux convertor (circular cone prism) for altering the light intensity distribution of the secondary light source is applied to the exposure apparatus 400, in particular, the illumination system 17 including the light source apparatus 110. Before starting the description thereabout, a description will be given of an external angle and an internal angle of the condensed light flux formed by the condenser 2 provided in the light source apparatus 110 with reference to FIG. 5B already mentioned. While the size of the light emitting point 1a is shown in exaggeration in FIG. 5B, the size of the light emitting point 1a is about 10 mm with respect to the distance, for example, 1,000 mm, between two focal points of the light source apparatus 110 mounted on the actual exposure apparatus 400. Thus, it may be considered that the external angle and the internal angle of the condensed light flux formed by the condenser 2 are ∠(FP1PO29FP2) and ∠(FP1PI25FP2), respectively. In the design of the typical exposure apparatus, the external angle ∠(FP1PO29FP2) is often set to about 20 degrees. If it is assumed that the external angle ∠(FP1PO29FP2) is 18 degrees, the internal angle ∠(FP1PI25FP2) may be set to 6 degrees which is ⅓ of the external angle ∠(FP1PO29FP2). Accordingly, it is assumed in the following description that the external angle ∠(FP1PO29FP2) is 18 degrees and the internal angle ∠(FP1PI25FP2) is 6 degrees.

Figure 10A:
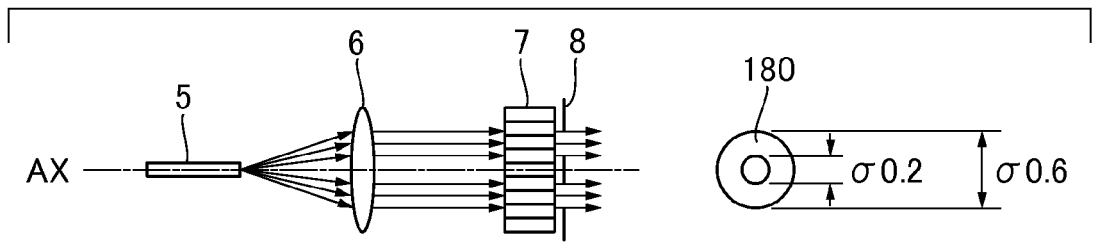
FIG. 10A is a diagram illustrating a case where a circular cone prism is applied to an illumination system.
Figure 10B:
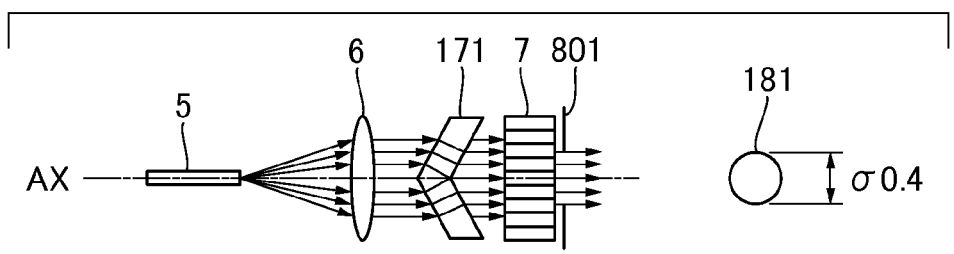
FIG. 10B is a diagram illustrating a case where a circular cone prism is applied to an illumination system.
Figure 10C:
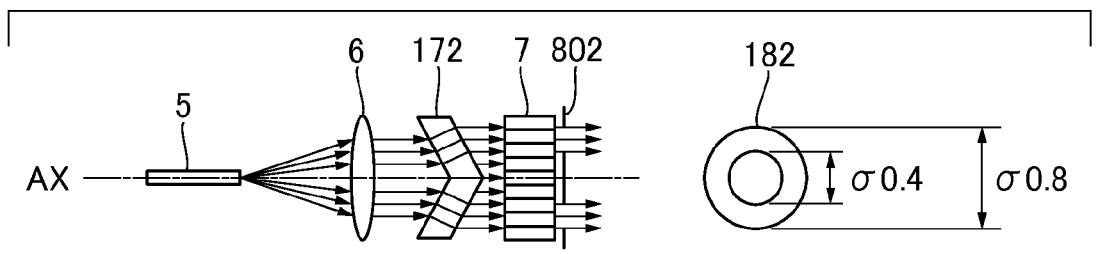
FIG. 10C is a diagram illustrating a case where a circular cone prism is applied to an illumination system.

FIGS. 10A to 10C are schematic views illustrating the case where a circular cone prism is applied to the illumination system 17, where the optical rod 5, the optical system 6, the optical integrator 7, and the aperture stop 8 in the illumination system 17 in FIG. 9 are shown on an enlarged scale. Among them, FIG. 10A shows the state where no circular cone prism is disposed. A light intensity distribution 180 shows a light intensity distribution of an image of the aperture plane 2b of the condenser 2, which is formed on the incident surface of the optical integrator 7 by the Fourier transform optical system 6. Here, the Fourier transform optical system 6 projects an image of the aperture plane 2b of the condenser 2 onto the incident surface of the optical integrator 7 such that the outer diameter of the light intensity distribution 180 is σ0.6. At this time, the inner diameter of the light intensity distribution 180 is σ0.2. Specifically, the light intensity distribution 180 is formed in a shape called "⅓ annular" of which the outer diameter is σ0.6 and the inner diameter is σ0.2.

FIG. 10B shows the state where a first circular cone prism 171 is disposed between the Fourier transform optical system 6 and the optical integrator 7 (disposed closer to the incident surface of the optical integrator 7) and a second aperture stop 801 is disposed. The first circular cone prism 171 is rotationally symmetrical about the optical axis AX and has inclined faces of which the two faces, i.e., the incident surface and the exiting surface are in parallel so as to move the incident light flux parallel to the optical axis AX inwardly in parallel relation. The second aperture stop 801 is provided instead of the aperture stop 8 shown in FIG. 10A so as to match the shape of the first circular cone prism 171. At this time, a light intensity distribution 181 is in a circular shape having an outer diameter of σ0.4 (inner diameter of σ0.0).

FIG. 10C shows the state where a second circular cone prism 172 is disposed between the Fourier transform optical system 6 and the optical integrator 7 (disposed closer to the incident surface of the optical integrator 7) and a third aperture stop 802 is disposed. The second circular cone prism 172 is in a shape such that the above first circular cone prism 171 is oriented counter to the direction of the optical axis AX so as to move the incident light flux parallel to the optical axis AX outwardly in parallel relation. The third aperture stop 802 is provided instead of the aperture stop 8 shown in FIG. 10A so as to match the shape of the second circular cone prism 172. At this time, the light intensity distribution 182 is formed in a shape called "½ annular" of which the outer diameter is σ0.8 and the inner diameter is σ0.4.

The illumination system 17 employs the light flux convertor as appropriate as described above so that the shape of an effective light source can be changed from the circular shape having an outer diameter of σ0.4 (an inner diameter of σ0.0) to the ½ annular shape having an outer diameter of σ0.8 and an inner diameter of σ0.4. In the above description, the illumination system 17 is configured to include an aperture stop. It should be noted that each aperture stop is not the essential component but may not be disposed when the diameter of each of the lenslets constituting the optical integrator 7 is sufficiently small and the difference of an image of the secondary light source, which is formed on the exiting surface of the optical integrator 7, in the XZ direction is negligible. While, in the present embodiment, the illumination system 17 is configured to employ the optical rod 5, the optical rod 5 is not the essential component.

As described above, the exposure apparatus of the present embodiment enables both space saving and power saving with use of the light source apparatus (illumination device) of the above embodiment.

(Fifth Embodiment)

Figure 13:
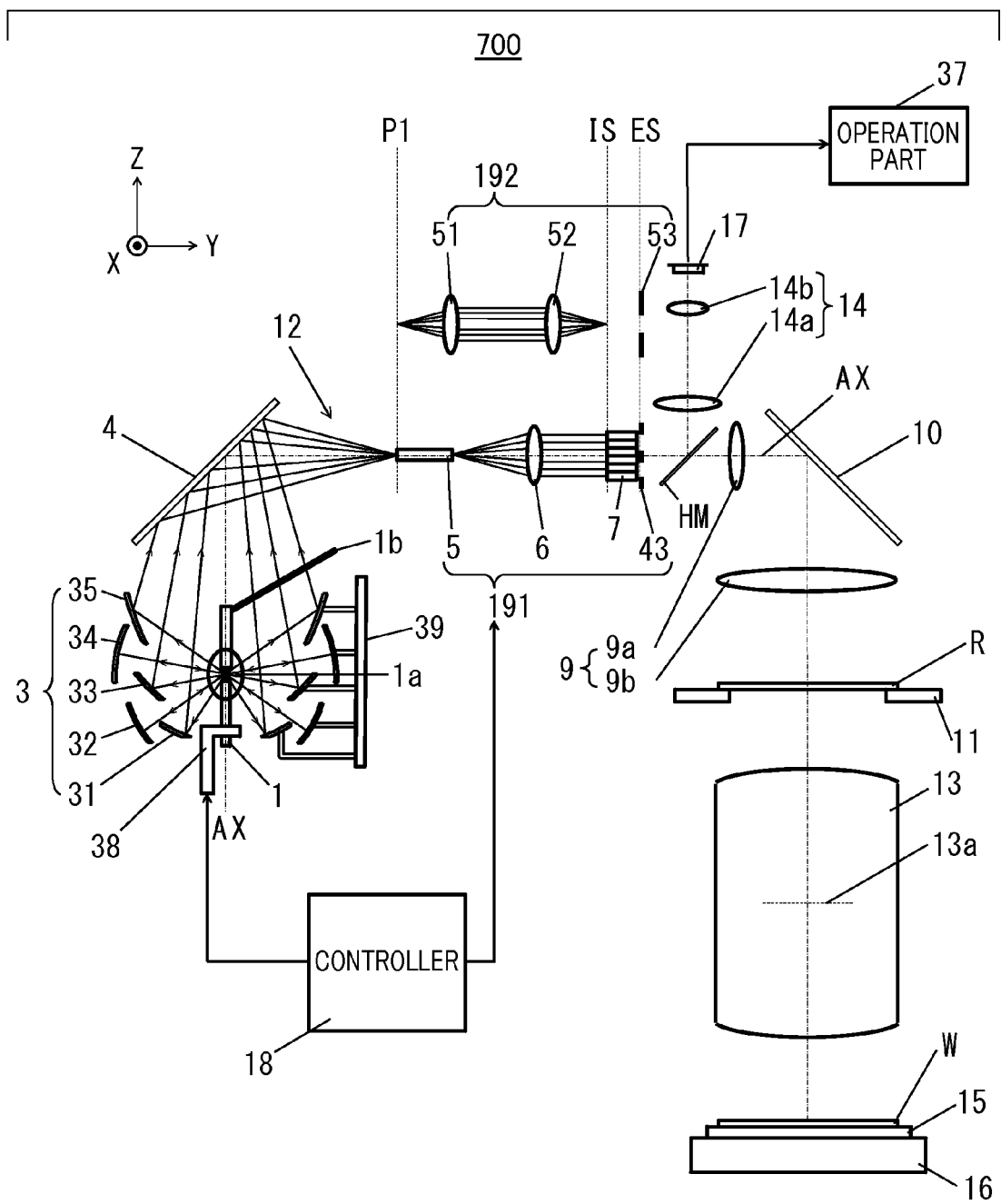
FIG. 13 is a diagram illustrating a configuration of an exposure apparatus according to one embodiment of the present invention.

Next, a description will be given of an illumination device according to a fifth embodiment of the present invention and an exposure apparatus including the illumination device. FIG. 13 is a schematic view illustrating a configuration of an exposure apparatus 700 according to the present embodiment. The exposure apparatus 700 is a projection type exposure apparatus that is used in, for example, a lithography step included in manufacturing steps of semiconductor devices to expose (transfer) an image of a pattern formed on a reticle R onto a wafer W (onto a substrate) by a scanning exposure system. In FIG. 13 and the following drawings, the Z axis is aligned parallel to the optical axis of the projection optical system 13, the Y axis is aligned in the scanning direction (a relative moving direction between the reticle R and the wafer W) of the wafer W upon exposure within the same plane perpendicular to the Z axis, and the X axis is aligned in the non-scanning direction orthogonal to the Y axis. The exposure apparatus 700 includes an illumination system 12, a reticle stage 11, a projection optical system 13, a wafer stage 16, and a controller 18.

The illumination system 12 is the illumination device according to the present embodiment that illuminates the reticle R by adjusting the light flux emitted from the light source 1. The details of the illumination system 12 will be described below. The reticle R is, for example, an original made of quartz glass, where a pattern to be transferred (e.g., circuit pattern) is formed on the wafer W. The reticle stage 11 is movable in both the X-axis and Y-axis directions while holding the reticle R. The projection optical system 13 projects light which has passed through the reticle R onto the wafer W at a predetermined magnification (e.g., ½). The wafer W is a substrate made of single crystal silicon. A resist (photoresist) is coated on the surface thereof. The wafer stage 16 is movable in the X-axis, Y-axis, and Z-axis directions (ωx, ωy, and ωz directions which are rotational directions about the x-, y- and z-axes, respectively, may also be included) while holding the wafer W via the wafer chuck 15.

The controller (exposure controller) 18 is constituted, for example, by a computer or the like and is connected to the components of the exposure apparatus 700 via a line to thereby control the operation and adjustment of the components in accordance with a program or the like. Note that the controller 18 may be integrated with the rest of the exposure apparatus 700 (provided in a shared housing) or may also be provided separately from the rest of the exposure apparatus 700 (provided in a separate housing). The illumination system 12 may also have a controller that independently executes the control of the operation of a drive system included in the illumination system 12, transmission/reception to/from the operation part 37 (to be described below) for executing various computations, and the like. Hereinafter, a description will be given on the assumption that the controller 18 executes operation control and the like of the overall illumination system 12 for simplicity.

Next, a specific description will be given of a configuration of the illumination system 12. The illumination system 12 includes a light source 1, a condenser mirror 3, a cold mirror 4, a first incident optical system 191, a second incident optical system 192, an optical integrator 7, a collimator 9, and a fold mirror 10. Among them, either the first incident optical system 191 or the second incident optical system 192 is selected depending on the illuminating condition upon exposure so as to be disposed as appropriate on the optical path of the illumination system 12.

The light source 1 is, for example, a high intensity super-high pressure mercury lamp that emits ultraviolet light, deep ultraviolet light, and the like. The light source 1 has two electrodes, i.e., cathode and anode, and emits light flux from a light emitting point (emission region) 1a which is formed between the electrodes and has a predetermined size. The light emitting portion 1a is positioned in the vicinity of the first focal points of a plurality of elliptical mirrors constituting the condenser mirror 3, and has a rotationally symmetrical emission intensity distribution. At this time, it can be said that the optical axis AX of the illumination system 12 is the rotationally symmetrical axis of the light emitting point 1*a*. Furthermore, the illumination system 12 includes a first driver (light source driver) 38 that displaces the light source 1 in each direction of XYZ-axes based on a command from the controller 18.

The condenser mirror (condenser) 3 is a multi-stage condenser having a plurality of reflection mirrors in which elliptical mirrors and spherical mirrors each having a rotationally symmetrical shape around the optical axis AX are alternately disposed. The condenser mirror 3 condenses the light flux emitted from the light source 1 so as to allow the light flux to be incident on the cold mirror 4. Hereinafter, the condenser mirror 3 in the present embodiment is intended to include, by way of example, five reflection mirrors consisting of a first elliptical mirror 31, a first spherical mirror 32, a second elliptical mirror 33, a second spherical mirror 34, and a third elliptical mirror 35. Here, these elliptical mirrors are elliptical surface reflection mirrors of which the reflecting surface for reflecting the light flux is elliptical. On the other hand, these spherical mirrors are spherical surface reflection mirrors of which the reflecting surface for reflecting the light flux is spherical. In particular, three elliptical mirrors 31, 33, and 35 are positioned such that the respective curvatures thereof are set so as to equalize the distance between their two focal points and to equalize their focal positions. More specifically, the light flux emitted from the light source 1 is condensed by the elliptical mirrors 31, 33, and 35 and then enters the cold mirror 4. The illumination system 12 also includes a second driver (reflection mirror driver) 39 that causes the reflection mirrors to be movable based on a command from the controller 18.

The cold mirror 4 is formed of a multilayer such as a dielectric or the like on the surface thereof. The cold mirror 4 mainly transmits infrared light and reflects ultraviolet light used as exposure light. More specifically, the light flux reflected by the cold mirror 4 forms an image of the light emitting portion 1*a* at a first position P1 in the vicinity of the second focal points of the elliptical mirrors 31, 33, and 35. As shown in FIG. 13, the cold mirror 4 folds the optical axis AX of the light flux emitted from the light source 1 from the Z-axis direction to the Y axis direction.

The first incident optical system (first optical system) 191 is an optical system that converts the light flux condensed by the condenser mirror 3 into first incident light to thereby guide the first incident light to the optical integrator 7. The first incident optical system 191 is configured such that the incident surface IS of the optical integrator 7 is set to be in optically pupil relation with a position at which the condenser mirror 3 condenses the light flux emitted from the light source 1. More specifically, the first incident optical system 191 includes the optical rod 5, the Fourier transform optical system 6, and an aperture stop (first stop) 43 which is disposed on the emitting surface ES of the optical integrator 7. The optical rod 5 is a columnar waveguide that is disposed such that the emitting surface thereof is positioned in the object plane of the Fourier transform optical system 6. The optical rod 5 is disposed to prevent the occurrence of a shadow of the lead wire 1*b*, which supplies power to the light source 1, on the incident surface IS. More specifically, the light flux incident on the optical rod 5 becomes a light beam (skew light beam) which swivels by being reflected by the cylindrical lateral surfaces, so that the shadow of the lead wire 1*b* included in the incident light flux is blurred and lost. The Fourier transform optical system 6 receives the light flux from the emitting surface of the optical rod 5 and converts the light flux into a substantially collimated light flux so as to cause the substantially collimated light flux to enter the incident surface IS of the optical integrator 7. The optical integrator 7 extends in the direction (the Y axis direction) of the optical axis AX and has a plurality of lenslets arrayed in parallel in the plane direction (the XZ-plane) perpendicular to the direction of the optical axis AX so as to form a secondary light source on its emitting surface ES. The aperture stop 43 shapes a secondary light source formed on the emitting surface ES of the optical integrator 7. For example, when the optical integrator 7 is constituted by about 100 fly-eye lenses, the ends of the secondary light source formed on the emitting surface ES are not in a continuous circular shape about the optical axis AX of the illumination system 12 but in a shape with sharp edges along the shape of the fly-eye lens. Accordingly, the aperture stop 43 shields a part of the secondary light source shaped with sharp edges so as to shape it in a circular shape. It should be noted that, if, for example, the optical integrator 7 is constituted by a fine optical element such as a microlens array and the shape of the light flux formed on the incident surface IS is substantially equal to that of the light flux obtained on the emitting surface ES, the aperture stop 43 may not necessarily be provided.

The second incident optical system (second optical system) 192 is an optical system that converts the light flux condensed by the condenser mirror 3 into second incident light differing from first incident light to thereby guide the second incident light to the optical integrator 7. The second incident optical system 192 is configured such that the incident surface IS of the optical integrator 7 is set to be in optically conjugate relation with a position at which the condenser mirror 3 condenses the light flux emitted from the light source 1. For example, the second incident optical system 192 includes a first Fourier transform optical system 51, a second Fourier transform optical system 52, and an aperture stop (second stop) 53 which is disposed on the emitting surface ES of the optical integrator 7. The light flux which is incident on the first Fourier transform optical system 51 disposed on the light source 1 side is converted into a substantially collimated light flux to be incident on the second Fourier transform optical system 52 disposed on the optical integrator 7 side. The light flux incident on the second Fourier transform optical system 52 is converted into a condensed light flux and then enters the incident surface IS so as to form a secondary light source on the emitting surface ES. As in the aperture stop 43 included in the first incident optical system 191, the aperture stop 53 shapes a secondary light source formed on the emitting surface ES. It should be noted that, if, for example, the optical integrator 7 is constituted by a fine optical element such as a microlens array and the shape of the light flux formed on the incident surface IS is substantially equal to that of the light flux obtained on the emitting surface ES, the aperture stop 53 may not necessarily be provided.

The first incident optical system 191 and the second incident optical system 192 are detachably (removably and attachably or switchably) disposed in the optical path of the illumination system 12. More specifically, the illumination system 12 may include a mechanism that enables the manual removal and attachment of the first incident optical system 191 and the second incident optical system 192. The illumination system 12 may also include a drive mechanism (optical system driver) that enables automatic switching between the first incident optical system 191 and the second incident optical system 192 based on a command from the controller 18.

The collimator 9 includes, for example, two optical systems 9a and 9b which are disposed with the fold mirror 10 sandwiched therebetween so as to illuminate the reticle R serving as an object to be irradiated placed on the reticle stage 11. If the collimator 9 is disposed in the illumination system 12 as described above, an image of the secondary light source formed on the emitting surface ES of the optical integrator 7 is formed in the vicinity of the pupil plane 13a of the projection optical system 13.

Furthermore, the illumination system 12 may include a half mirror HM, a detection optical system 14, a detector 17, and an operation part 37. The half mirror HM is disposed between the optical integrator 7 and the collimator 9 (the optical system 9a) and reflects a portion of the light flux emitted from the optical integrator 7 toward the detection optical system 14. The detection optical system 14 includes, for example, two optical systems 14a and 14b and projects an image of the secondary light source formed on the emitting surface of the optical integrator 7 onto the detector 17 (reduction projection). The detector 17 is, for example, a photoelectric conversion element such as a four-section sensor, a two-dimensional CCD, or the like that detects an image of the projected secondary light source. The operation part 37 computes the total light quantity of an image of the secondary light source and the symmetry of the light intensity distribution based on the output of the detector 17 and transmits the resulting information to a controller 36.

Next, a description will be given of the effect of the illumination system 12 (the exposure apparatus 700 using the same). The illumination system 12 varies a light intensity distribution of the light flux formed on the incident surface IS of the optical integrator 7 depending on a resolution line width, discreteness, and the like of a pattern formed on the reticle R. In this manner, the illumination system 12 may vary the light intensity distribution of the secondary light source formed on the pupil plane 13a of the projection optical system 13.

Firstly, a description will be given of the method for varying the light intensity distribution on the incident surface IS of the optical integrator 7. Each of FIGS. 14A, 14B, 15A and 15B is a schematic view illustrating an optical system for explaining the light intensity distribution formed by the light flux emitted from the light source 1. In FIGS. 14A and 14B and FIGS. 15A and 15B, the cold mirror 4 and the optical rod 5 are omitted for simplicity of illustration. Thus, the optical axis of the illumination system 12 extends in the Z-axis direction in FIGS. 14 and 15. Here, when the first incident optical system 191 is applied to the illumination system 12, the first position P1 is at a position facing the incident surface of the optical rod 5. On the other hand, when the second incident optical system 192 is applied to the illumination system 12, the first position P1 is at a position conjugate with the incident surface IS. Thus, the second incident optical system 192 may reform (image) the light intensity distribution of the light flux formed on the first position P1 on the incident surface IS. When the illumination system 12 employs the first incident optical system 191, the second position P2 is at a position facing the pupil plane of the Fourier transform optical system 6 and at a position facing the incident surface IS.

Firstly, FIG. 14A shows the reference state of the condenser mirror 3. Here, the reference state refers to a state of satisfying the following conditions. The first condition is that the first focal positions of the elliptical mirrors 31, 33, and 35 constituting the condenser mirror 3 coincide with each other and the second focal positions thereof also coincide with each other. The second condition is that the second focal positions of the elliptical mirrors 31, 33, and 35 coincide with the first position P1. The third condition is that the center of curvature (central point) of each of the spherical mirrors 32 and 34 constituting the condenser mirror 3 coincides with the first focal positions of the three elliptical mirrors. If the light emitting portion 1a is positioned at the first focal position of the elliptical mirrors 31, 33, and 35 in this state, the light flux emitted from the light emitting portion 1a is reflected by the elliptical mirrors 31, 33, and 35 to form light fluxes 211, 231, and 251, respectively, which are condensed at the first position P1 serving as the second focal position. On the other hand, a portion of the light flux emitted from the light emitting portion 1a is reflected by the second spherical mirror 34, is condensed at the light emitting portion 1a, and then is reflected by the second elliptical mirror 33 facing the second spherical mirror 34 to form a portion of the light flux 231, which is condensed at the first position P1. Likewise, another portion of the light flux emitted from the light emitting portion 1a is reflected by the first spherical mirror 32, is condensed at the light emitting portion 1a, and then is reflected by the third elliptical mirror 35 facing the first spherical mirror 32 to form a portion of the light flux 251, which is condensed at the first position P1. The light fluxes 211, 231, and 251 are condensed at the first position P1, and then are incident on the Fourier transform optical system 6 to be converted into a substantially collimated light flux. Consequently, a light intensity distribution of an annular shape is formed at the second position P2 on the pupil plane of the Fourier transform optical system 6.

Figure 16A:
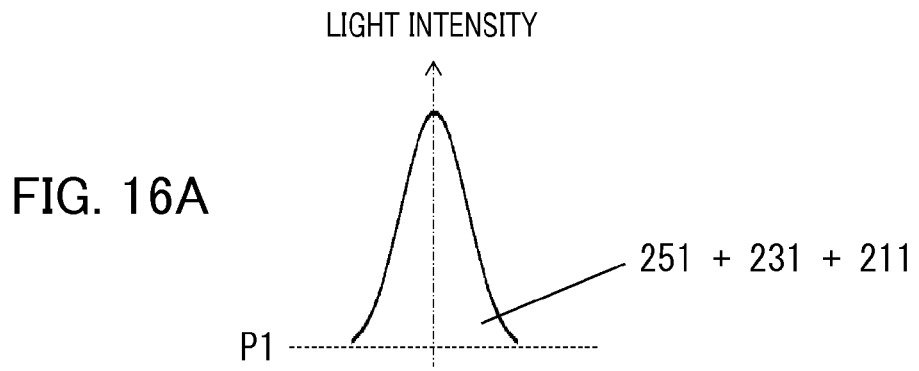
FIG. 16A is a diagram illustrating a first example of a light intensity distribution of light flux formed by a condenser mirror.
Figure 16B:
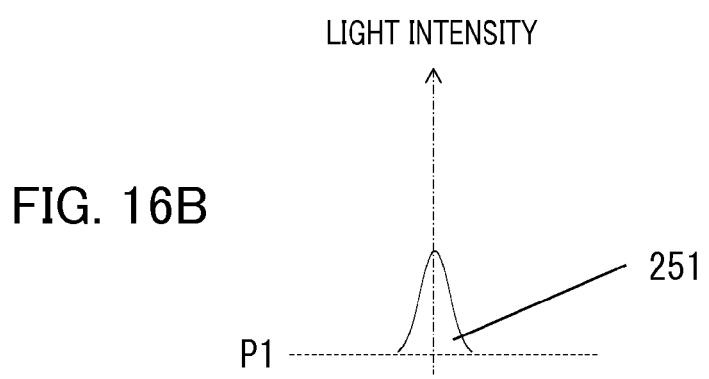
FIG. 16B is a diagram illustrating a first example of a light intensity distribution of light flux formed by a condenser mirror.
Figure 16C:
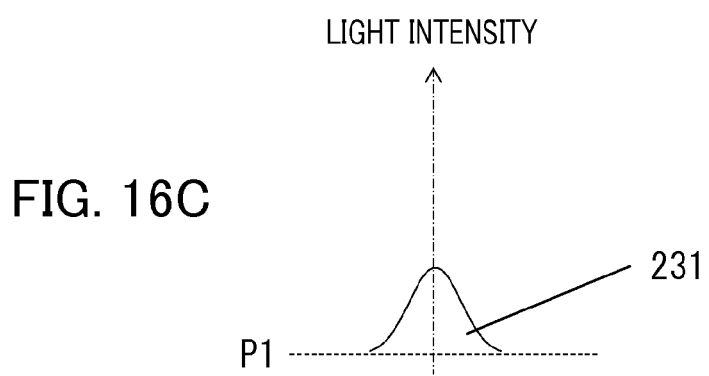
FIG. 16C is a diagram illustrating a first example of a light intensity distribution of light flux formed by a condenser mirror.
Figure 16D:
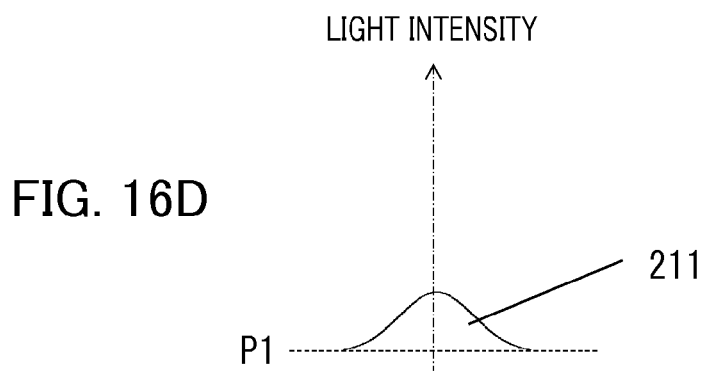
FIG. 16D is a diagram illustrating a first example of a light intensity distribution of light flux formed by a condenser mirror.

FIGS. 16A to 16D are diagrams illustrating the first example of a light intensity distribution of a light flux formed (condensed) at the first position P1 by the condenser mirror 3, which correspond to the state shown in FIG. 14A. Among them, FIG. 16A shows a light intensity distribution generated as a result of overlapping of the light fluxes 251, 231, and 211. FIGS. 16B to 16D show light intensity distributions generated by the light fluxes 251, 231, and 211, respectively. When the second incident optical system 192 is applied to the illumination system 12, the light intensity distributions formed at the first position P1 shown in FIGS. 16A to 16D are formed on the incident surface IS of the optical integrator 7. In this case, the light condensing points of the elliptical mirrors 31, 33, and 35 coincide with the first position P1, and thus, the peak intensity in each of the light intensity distributions formed by the light fluxes 251, 231, and 211 becomes the highest as shown in FIGS. 16B to 16D. Thus, as shown in FIG. 16A, the peak intensity in the light intensity distribution generated as a result of overlapping of the light fluxes 251, 231, and 211 also becomes the highest.

Figure 17A:
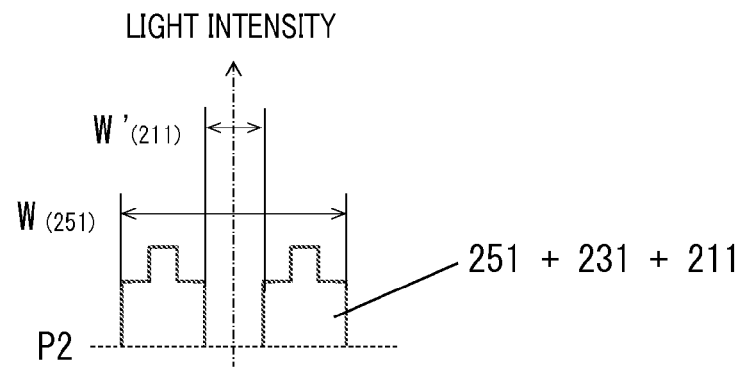
FIG. 17A is a diagram illustrating a second example of a light intensity distribution of light flux formed by a condenser mirror.
Figure 17B:
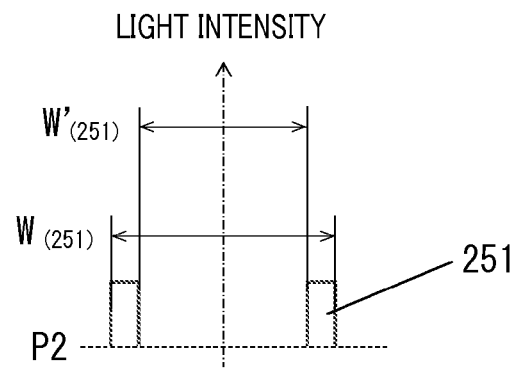
FIG. 17B is a diagram illustrating a second example of a light intensity distribution of light flux formed by a condenser mirror.
Figure 17C:
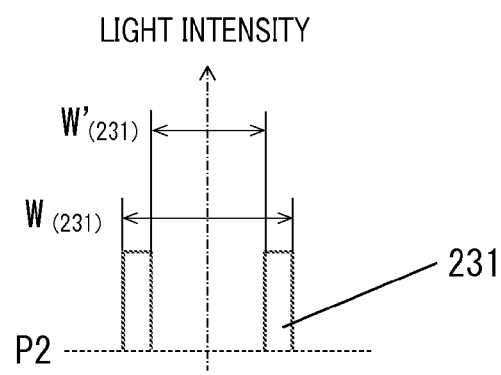
FIG. 17C is a diagram illustrating a second example of a light intensity distribution of light flux formed by a condenser mirror.
Figure 17D:
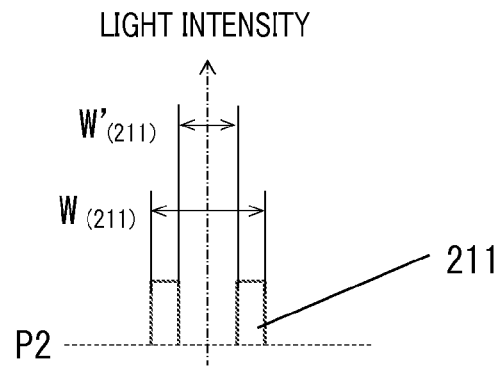
FIG. 17D is a diagram illustrating a second example of a light intensity distribution of light flux formed by a condenser mirror.

FIGS. 17A to 17D are diagrams illustrating the second example of a light intensity distribution of a light flux formed at the second position P2 by the condenser mirror 3, which correspond to the state shown in FIG. 14A. Among them, FIG. 17A shows a light intensity distribution generated as a result of overlapping of the light fluxes 251, 231, and 211. FIGS. 17B to 17D show light intensity distributions generated by the light fluxes 251, 231, and 211, respectively. In FIGS. 17A to 17D, the outer diameter and the inner diameter of the light intensity distribution of the light flux 251 are denoted as W (251) and W' (251), respectively. Likewise, the outer diameter and the inner diameter of the light intensity distribution of the light flux 231 are denoted as W (231) and W' (231), respectively. The outer diameter and the inner diameter of the light intensity distribution of the light flux 211 are denoted as W (211) and W' (211), respectively. When the first incident optical system 191 is applied to the illumination system 12, the light intensity distributions formed at the second position P2 shown in FIGS. 17A to 17D are formed on the incident surface IS of the optical integrator 7. Here, the ellipticity (short diameter/long diameter) of each of the elliptical mirrors 31, 33, and 35 is in a relationship of (the ellipticity of the elliptical mirror 31)>(the ellipticity of the elliptical mirror 33)>(the ellipticity of the elliptical mirror 35). Furthermore, the ellipticity (short diameter/long diameter) of each of the elliptical mirrors 31, 33, and 35 is set such that the elliptical mirrors 31, 33, and 35 have the same focal length (the distance between the first focal position and the second focal position) and satisfy the relationship of W' (251)=W (231) and W' (231)=W (211). Thus, as shown in FIG. 17A, the light intensity distribution generated as a result of overlapping of the light fluxes 251, 231, and 211 is in an annular shape of which the outer diameter is W (251) and the inner diameter is W' (211).

Next, FIG. 14B shows a state where the positions of the first elliptical mirror 31 and the third elliptical mirror 35 from among the elliptical mirrors constituting the condenser mirror 3 are moved from the reference state shown in FIG. 14A. In particular, in the example shown in FIG. 14B, the first elliptical mirror 31 is moved in the −Z direction and the third elliptical mirror 35 is moved in the +Z direction. In the present embodiment, the Z axis is parallel to the optical axis of the illumination system 12. Here, the light flux 211b is the light flux reflected by the first elliptical mirror 31 moved in the −Z direction. The light flux 211b is reflected by the first elliptical mirror 31, is condensed at a position which is to the negative side (the condenser 2 side) of the first position P1 in the Z-axis direction, and then is incident on the Fourier transform optical system 6 to be converted into a substantially collimated light flux. Consequently, a light intensity distribution of an annular shape is formed at the second position P2 on the pupil plane of the Fourier transform optical system 6. At this time, the light flux 211b is condensed at a position closer to the condenser mirror 3 than the first position P1, and thus, is incident on the Fourier transform optical system 6 at a larger angle than that of the light flux 211 in FIG. 14A. On the other hand, the light flux 251b includes the light flux reflected by the third elliptical mirror 35 moved in the +Z direction and the light flux reflected by the third elliptical mirror 35 moved in the +Z direction after being reflected by the first spherical mirror 32. The light flux 251b is reflected by the third elliptical mirror 35, is condensed at a position which is to the positive side of the first position P1 in the Z-axis direction, and then is incident on the Fourier transform optical system 6 to be converted into a substantially collimated light flux. Consequently, a light intensity distribution of an annular shape is formed at the second position P2 on the pupil plane of the Fourier transform optical system 6. At this time, the light flux 251b is condensed at a position distant from the condenser mirror 3 than the first position P1, and thus, is incident on the Fourier transform optical system 6 at a smaller angle than that of the light flux 251 in FIG. 14A.

Figure 18A:
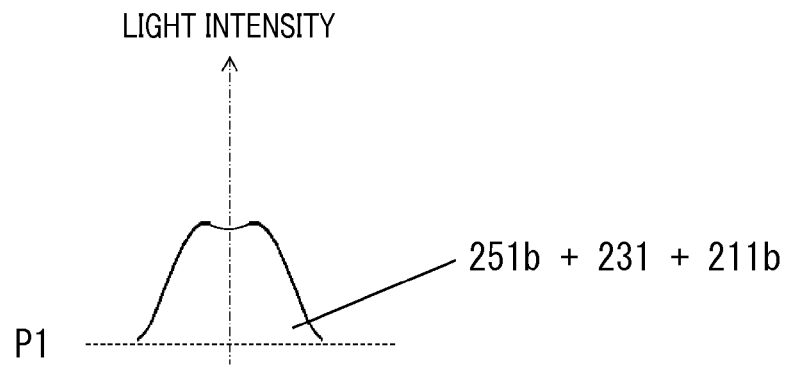
FIG. 18A is a diagram illustrating a third example of a light intensity distribution of light flux formed by a condenser mirror.
Figure 18B:
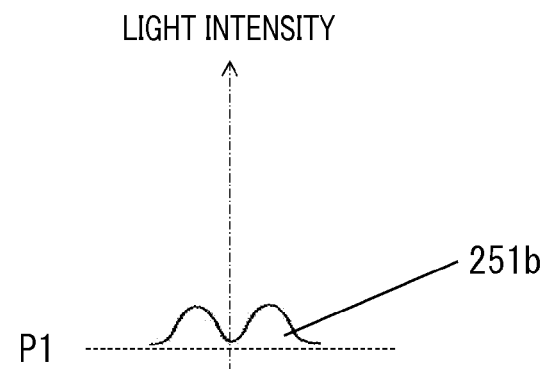
FIG. 18B is a diagram illustrating a third example of a light intensity distribution of light flux formed by a condenser mirror.
Figure 18C:
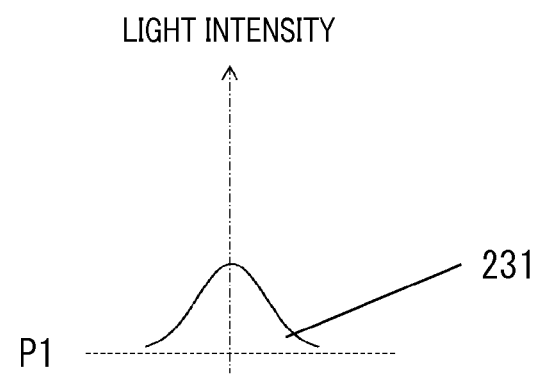
FIG. 18C is a diagram illustrating a third example of a light intensity distribution of light flux formed by a condenser mirror.
Figure 18D:
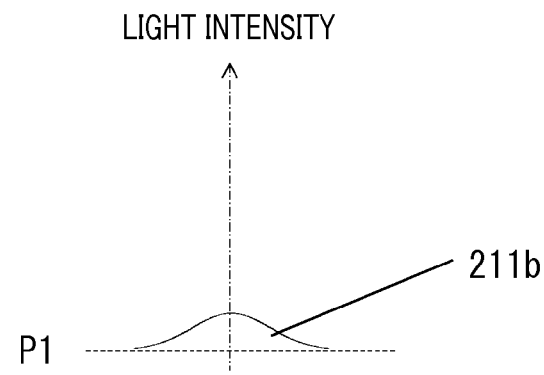
FIG. 18D is a diagram illustrating a third example of a light intensity distribution of light flux formed by a condenser mirror.

FIGS. 18A to 18D are diagrams illustrating the third example of a light intensity distribution of a light flux formed at the first position P1 by the condenser mirror 3, which correspond to the state shown in FIG. 14B. Among them, FIG. 18A shows a light intensity distribution generated as a result of overlapping of the light fluxes 251b, 231, and 211b. FIGS. 18B to 18D show light intensity distributions generated by the light flux 251b, 231, and 211b, respectively. When the second incident optical system 192 is applied to the illumination system 12, the light intensity distributions formed at the first position P1 shown in FIGS. 18A to 18D are formed on the incident surface IS of the optical integrator 7. In this case, as shown in FIG. 18D, the light intensity distribution formed by the light flux 211b has lower peak intensity and wider flared ends than those of the light intensity distribution of the light flux 211 shown in FIG. 16D. As shown in FIG. 18A, the light intensity distribution formed by the light flux 251b has lower peak intensity and wider flared ends than those of the light intensity distribution of the light flux 251 shown in FIG. 16A and is further divided into two peaks. This is because the light condensing points of the light flux 211b and the light flux 251b are spaced apart from the first position P1. In particular, the reason why the light intensity distribution formed by the light flux 251b is divided into two peaks is because the condensed angle of the light flux 251b is greater than the condensed angle of the light flux 211b. Thus, as shown in FIG. 18A, the light intensity distribution generated as a result of overlapping of the light fluxes 251b, 231, and 211b has a substantially flat peak and widely flared ends as compared with the light intensity distribution shown in FIG. 16A.

Figure 19A:
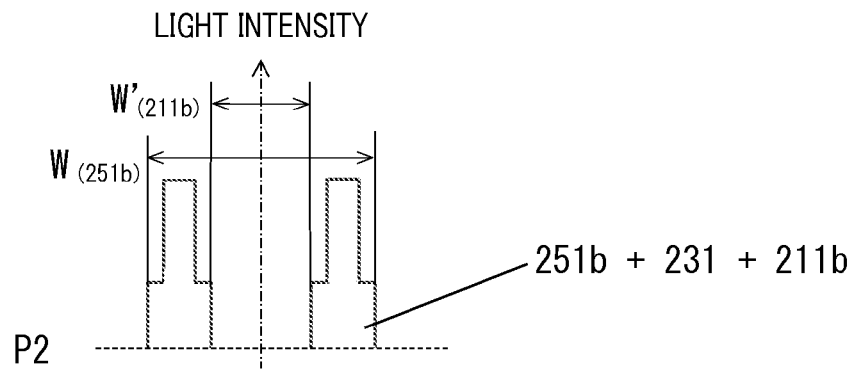
FIG. 19A is a diagram illustrating a fourth example of a light intensity distribution of light flux formed by a condenser mirror.
Figure 19B:
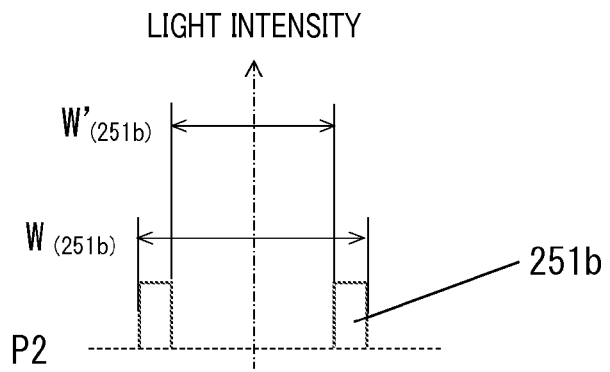
FIG. 19B is a diagram illustrating a fourth example of a light intensity distribution of light flux formed by a condenser mirror.
Figure 19C:
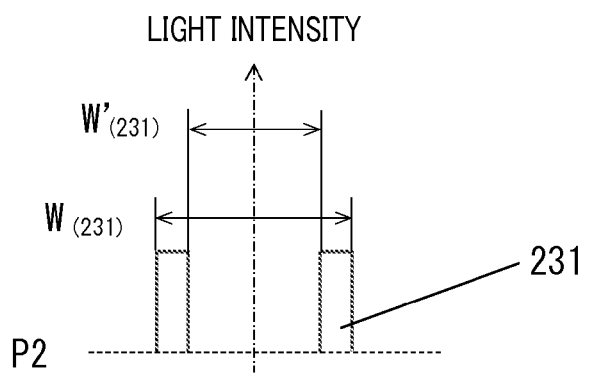
FIG. 19C is a diagram illustrating a fourth example of a light intensity distribution of light flux formed by a condenser mirror.
Figure 19D:
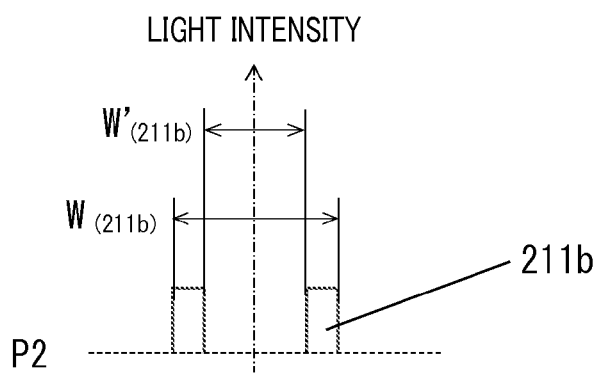
FIG. 19D is a diagram illustrating a fourth example of a light intensity distribution of light flux formed by a condenser mirror.

FIGS. 19A to 19D are diagrams illustrating the fourth example of a light intensity distribution of a light flux formed at the second position P2 by the condenser mirror 3, which correspond to the state shown in FIG. 14B. Among them, FIG. 19A shows a light intensity distribution generated as a result of overlapping of the light fluxes 251b, 231, and 211b. FIGS. 19B to 19D show light intensity distributions generated by the light flux 251b, 231, and 211b, respectively. In FIGS. 19A to 19D, the outer diameter and the inner diameter of the light intensity distribution of the light flux 251b are denoted as W (251b) and W' (251b), respectively. Likewise, the outer diameter and the inner diameter of the light intensity distribution of the light flux 231 are denoted as W (231) and W' (231), respectively. The outer diameter and the inner diameter of the light intensity distribution of the light flux 211b are denoted as W (211b) and W' (211b), respectively. When the first incident optical system 191 is applied to the illumination system 12, the light intensity distributions formed at the second position P2 shown in FIGS. 19A to 19D are formed on the incident surface IS of the optical integrator 7. Here, the light flux 211b shown in FIG. 14B is incident on the Fourier transform optical system 6 at a larger angle than that of the light flux 211 shown in FIG. 14A. Thus, the outer diameter W (211b) of the light intensity distribution of the light flux 211 and the inner diameter W' (231) of the light flux 231 satisfy the relationship of W' (231)<W (211b). The light flux 251b shown in FIG. 14B is incident on the Fourier transform optical system 6 at a smaller angle than that of the light flux 251 shown in FIG. 14A. Thus, the inner diameter W' (251b) of the light intensity distribution of the light flux 251 and the outer diameter W (231) of the light flux 231 satisfy the relationship of W' (251)<W (231). Thus, as shown in FIG. 19A, the width of the annular portion of the light intensity distribution generated as a result of overlapping of the light fluxes 251b, 231, and 211b becomes narrow as compared with that of the light intensity distribution shown in FIG. 17A. The width {W (251b)–W' (211b)} of the annular portion of the light intensity distribution shown in FIG. 19A and the width {W (251)–W' (211)} of the annular portion of the light intensity distribution shown in FIG. 17A satisfy the relationship of {W (251b)–W' (211b)}<{W (251)–W' (211)}.

Next, FIG. 15A shows a state where the position of the second spherical mirror 34 from among the elliptical mirrors constituting the condenser mirror 3 is moved from the reference state shown in FIG. 14A. In particular, in the example shown in FIG. 15A, the second spherical mirror 34 is moved in the −Z direction. Here, the light flux reflected by the second spherical mirror 34 does not return back to the light emitting portion 1a but is shielded by the electrodes constituting the light source 1, and thus, does not reach the second elliptical mirror 33. The light flux 231c is formed of the light flux reflected by the second elliptical mirror 33 only, and thus, has a low light intensity as compared with the light flux 231 shown in FIG. 14A. Note that the states of the light fluxes 251 and 211 are the same as those of the light fluxes 251 and 211 shown in FIG. 14A.

Figure 20A:
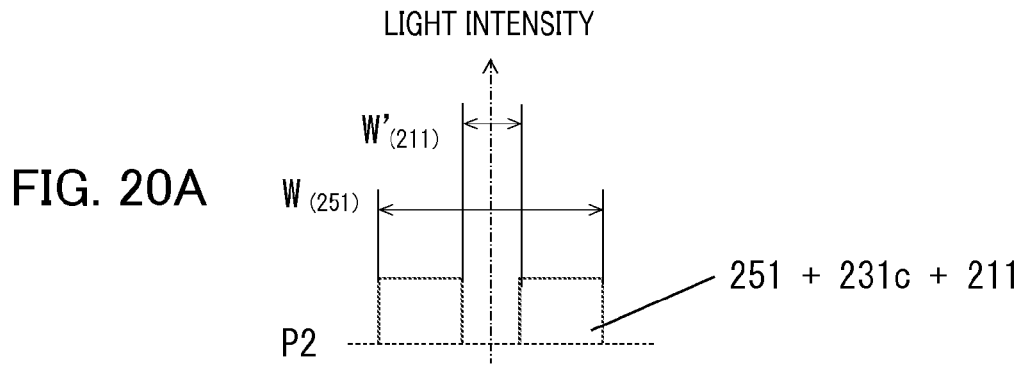
FIG. 20A is a diagram illustrating a fifth example of a light intensity distribution of light flux formed by a condenser mirror.
Figure 20B:
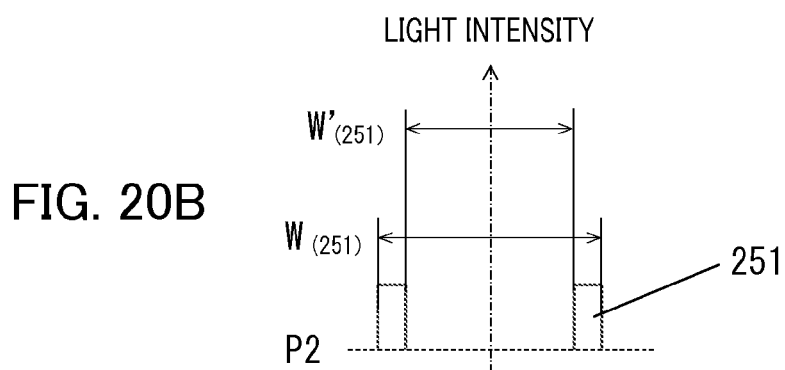
FIG. 20B is a diagram illustrating a fifth example of a light intensity distribution of light flux formed by a condenser mirror.
Figure 20C:
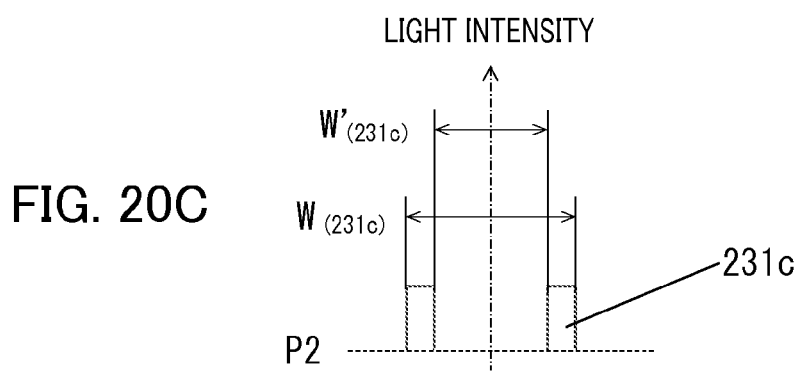
FIG. 20C is a diagram illustrating a fifth example of a light intensity distribution of light flux formed by a condenser mirror.
Figure 20D:
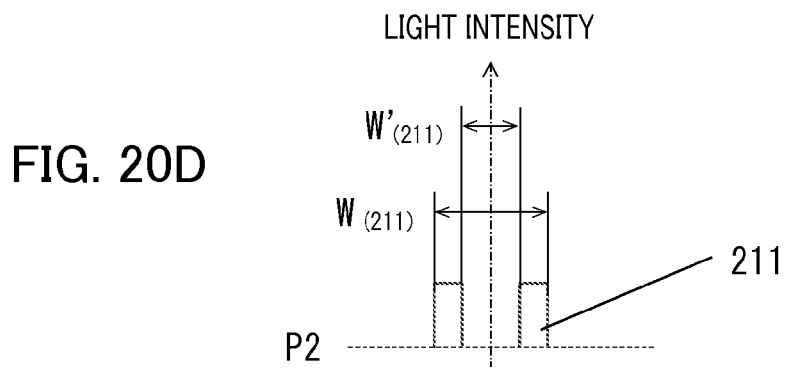
FIG. 20D is a diagram illustrating a fifth example of a light intensity distribution of light flux formed by a condenser mirror.

FIGS. 20A to 20D are diagrams illustrating the fifth example of a light intensity distribution of a light flux formed at the second position P2 by the condenser mirror 3, which correspond to the state shown in FIG. 15A. Among them, FIG. 20A shows a light intensity distribution generated as a result of overlapping of the light fluxes 251, 231c, and 211. FIGS. 20B to 20D show light intensity distributions generated by the light flux 251, 231c, 211, respectively. When the first incident optical system 191 is applied to the illumination system 12, the light intensity distributions formed at the second position P2 shown in FIGS. 20A to 20D are formed on the incident surface IS of the optical integrator 7. In this case, in contrast to the case shown in FIG. 17C, the peak intensity in the light intensity distribution of an annular shape formed by the light flux 231c shown in FIG. 20C is equal to the peak intensity in the light intensity distribution of an annular shape formed by each of the light fluxes 251 and 211. Thus, the light intensity distribution generated as a result of overlapping of the light fluxes 251, 231c, and 211 has a flat peak intensity as compared with the light intensity distribution generated as a result of overlapping of the light fluxes 251, 231, and 211 shown in FIG. 17A.

Next, FIG. 15B shows a state where the position of the second elliptical mirror 33 is further moved from the state where the first elliptical mirror 31 and the third elliptical mirror 35 among the elliptical mirrors constituting the condenser mirror 3 are moved as shown in FIG. 14B. In particular, in the example shown in FIG. 15B, the second elliptical mirror 33 is moved in the −Z direction. Here, the light flux 231d is the light flux reflected by the second elliptical mirror 33 moved in the −Z direction. The light flux 231d is reflected by the second elliptical mirror 33, is condensed at a position which is to the negative side of the first position P1 in the Z-axis direction, and then is incident on the Fourier transform optical system 6. The light flux 231d incident on the Fourier transform optical system 6 is converted into a substantially collimated light flux. Consequently, a light intensity distribution of an annular shape is formed at the second position P2 on the pupil plane of the Fourier transform optical system 6. In this case, the light flux 231d is condensed at a position closer to the condenser mirror 3 than the first position P1, and thus, is incident on the Fourier transform optical system 6 at a larger angle than that of the light flux 211 in FIG. 14A.

Figure 21A:
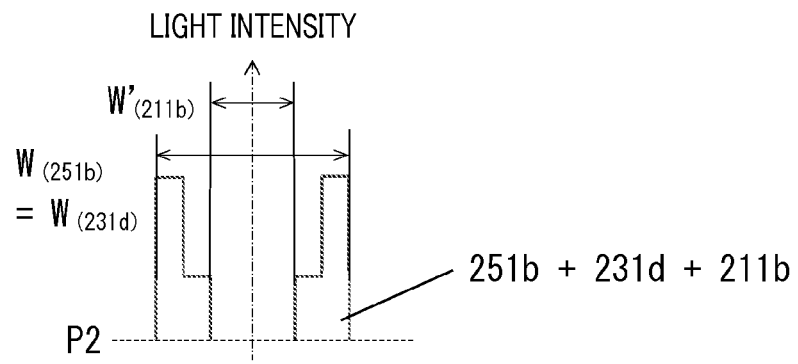
FIG. 21A is a diagram illustrating a sixth example of a light intensity distribution of light flux formed by a condenser mirror.
Figure 21B:
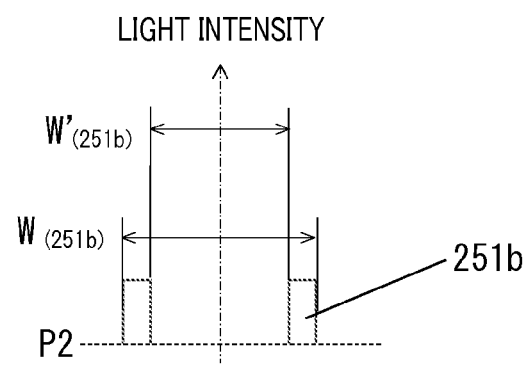
FIG. 21B is a diagram illustrating a sixth example of a light intensity distribution of light flux formed by a condenser mirror.
Figure 21C:
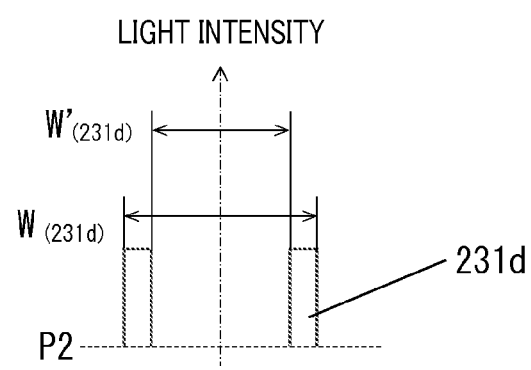
FIG. 21C is a diagram illustrating a sixth example of a light intensity distribution of light flux formed by a condenser mirror.
Figure 21D:
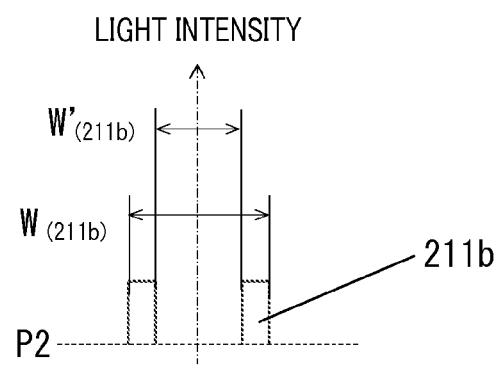
FIG. 21D is a diagram illustrating a sixth example of a light intensity distribution of light flux formed by a condenser mirror.

FIGS. 21A to 21D are diagrams illustrating the sixth example of a light intensity distribution of a light flux formed at the second position P2 by the condenser mirror 3, which correspond to the state shown in FIG. 15B. Among them, FIG. 21A shows a light intensity distribution generated as a result of overlapping of the light fluxes 251b, 231d, and 211b. FIGS. 21B to 21D show light intensity distributions generated by the light fluxes 251b, 231d, and 211b, respectively. When the first incident optical system 191 is applied to the illumination system 12, the light intensity distributions formed at the second position P2 shown in FIGS. 21A to 21D are formed on the incident surface IS of the optical integrator 7. In FIGS. 21A to 21D, the outer diameter and the inner diameter of the light intensity distribution of the light flux 231d are denoted as W (231d) and W' (231d), respectively. In FIG. 15B, the angle at which the light flux 231d is incident on the Fourier transform optical system 6 is set such that the outer diameter W (231d) of the light intensity distribution of the light flux 231d shown in FIGS. 21A to 21D and the outer diameter W (251b) of the light intensity distribution of the light flux 251b satisfy the relationship of W (231d)=W (251b). Thus, the position of the peak intensity in the light intensity distribution shown in FIG. 21A is brought closer to the outside of the annular portion as compared with the position of the peak intensity in the light intensity distribution shown in FIG. 19A.

Figure 22:
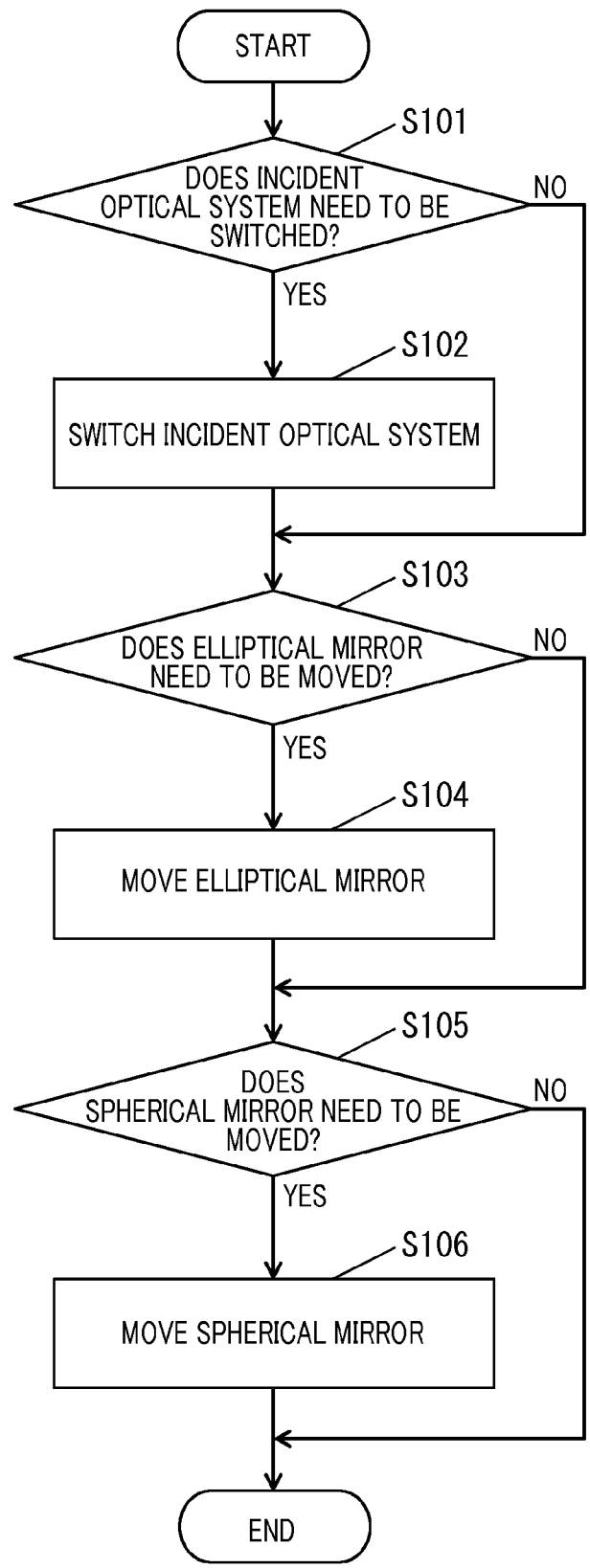
FIG. 22 is a flowchart illustrating the flow of the moving step of elliptical mirrors and spherical mirrors.

Next, a description will be given of the method for moving each of elliptical mirrors and spherical mirrors constituting the condenser mirror 3 in the illumination system 12. FIG. 22 is a flowchart illustrating the steps (moving method) of moving the elliptical mirrors and the spherical mirrors in the present embodiment. Firstly, the controller 18 determines whether or not an incident optical system (the first incident optical system 191 or the second incident optical system 192) disposed on the optical path needs to be switched due to the condition of the incident optical system set in a job (step S101). Here, if the controller 18 determines that the incident optical system needs to be switched (Yes), the incident optical system is switched by using a drive mechanism (not shown) (step S102). On the other hand, if the controller 18 determines that the incident optical system does not need to be switched (No), the processing shifts to step S103. Next, the controller 18 determines whether or not at least any one of the elliptical mirrors 31, 33, and 35 needs to be moved due to the condition of the positions in the Z-axis direction of the elliptical mirrors 31, 33, and 35 included in the condenser mirror 3 set in a job (step S103). Here, if the controller 18 determines that at least any one of the elliptical mirrors 31, 33, and 35 needs to be moved (Yes), the controller 18 drives the second driver 15 and causes it to move the elliptical mirror to a position set in a job (step S104). On the other hand, if the controller 18 determines that no elliptical mirror needs to be moved (No), the processing shifts to step S105. Then, the controller 18 determines whether or not at least any one of the spherical mirrors 32 and 34 needs to be moved due to the condition of the positions in the Z-axis direction of the spherical mirrors 32 and 34 included in the condenser mirror 3 set in a job (step S105). Here, if the controller 18 determines that at least any one of the spherical mirrors 32 and 34 needs to be moved (Yes), the controller 18 drives the second driver 15 and causes it to move the spherical mirror to a position set in a job (step S106), and the moving step is completed. On the other hand, if the controller 18 determines that no spherical mirror needs to be moved (No), the moving step is simply completed. It should be noted that, in the above moving step, information about which incident optical system is used and about where the elliptical mirrors and the spherical mirrors are positioned in the Z-axis direction is defined in advance for each illuminating condition. In this manner, a user firstly inputs a job about a desired illuminating condition, so that the controller 18 can automatically set which incident optical system is used and where the elliptical mirrors and the spherical mirrors are positioned in the Z-axis direction.

Next, a description will be given of the adjustment method of a secondary light source in the exposure apparatus 700. In the above description, the first incident optical system 191 and the second incident optical system 192 are switched as appropriate in order to obtain a desired light intensity distribution in the illumination system 12 and a lamp may be used as the light source 1. Thus, for example, if an error occurs in the switching operation of the incident optical system, the symmetry of the light intensity distribution of an image of the secondary light source may vary. In addition, the total light quantity of an image of the secondary light source may vary due to exhaustion of the lamp electrodes associated with turning on the light source 1. Accordingly, the exposure apparatus 700 adjusts a secondary light source by altering the position of the light source 1 as appropriate to be described below so as to favorably maintain the light intensity distribution of an image of the secondary light source.

Figure 23:
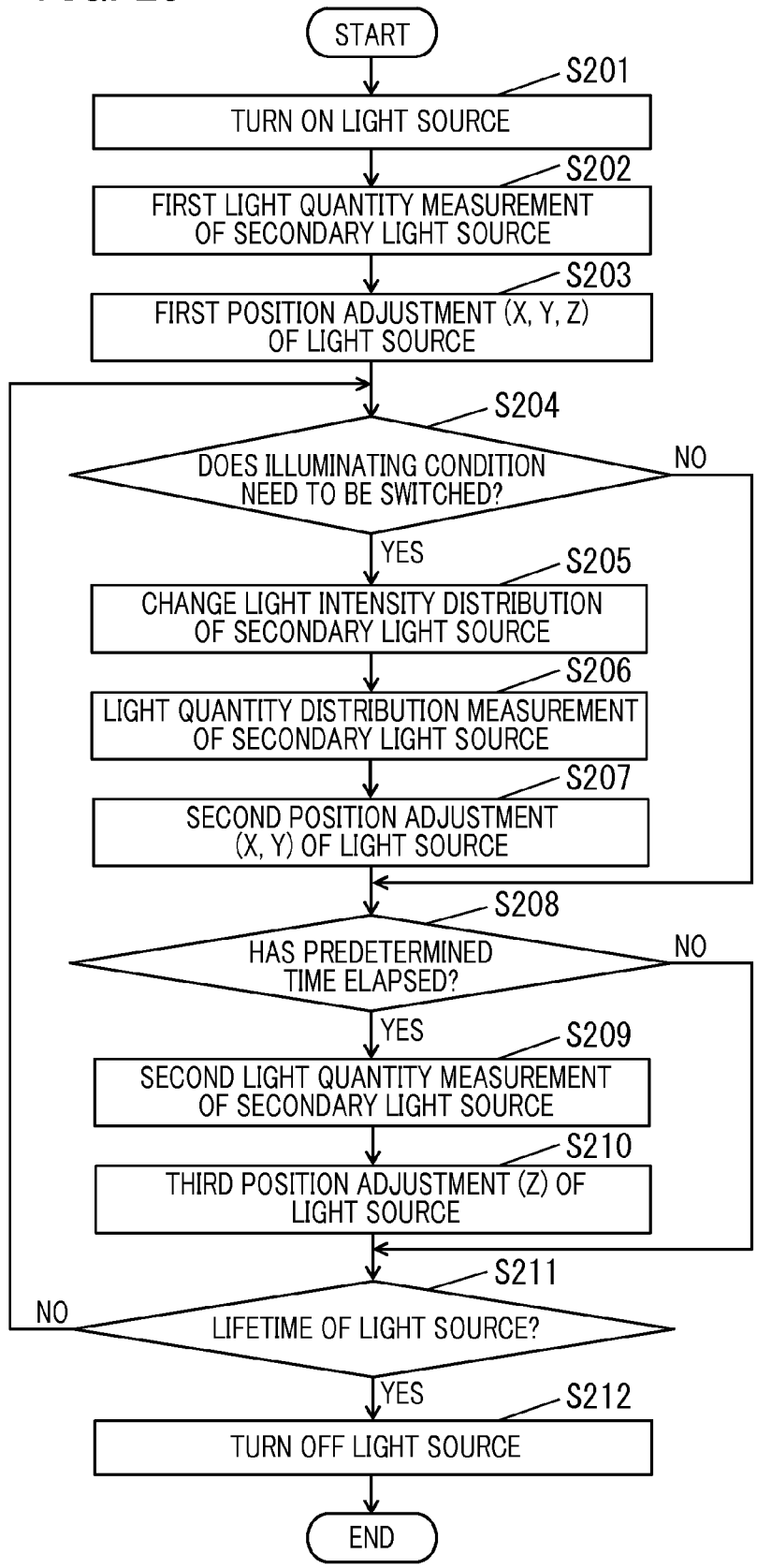
FIG. 23 is a flowchart illustrating the flow of the adjustment step of a secondary light source.

FIG. 23 is a flowchart illustrating the adjustment step (adjustment method) of a secondary light source. Firstly, the controller 18 turns on the light source 1 (step S201). Next, the controller 18 causes the operation part 37 to compute the total light quantity of an image of the secondary light source based on the output of the detector 17 so as to acquire information about the total light quantity from the operation part 37 (step S202: the first light quantity measurement of the secondary light source). Next, the controller 18 causes the first driver 35 to move the position of the light source 1 in the X-, Y-, and Z-axis directions such that the value of the obtained total light quantity becomes the maximum value (step S203: first position adjustment).

Next, the controller 18 determines whether or not the illuminating condition needs to be switched based on the condition preset in a job (step S204). Here, if the controller 18 determines that the illuminating condition needs to be switched (Yes), the controller 18 causes a drive mechanism (not shown) to drive the first incident optical system 191 or the second incident optical system 192 and causes the second driver 15 to drive the reflection mirrors constituting the condenser mirror 3 as appropriate (step S205). In this manner, the light intensity distribution of the light flux incident on the optical integrator 7 is changed. Next, after step S205, the controller 18 causes the operation part 37 to compute the symmetry of the light intensity distribution of an image of the secondary light source based on the output of the detector 17 so as to acquire information about the symmetry of the light intensity distribution from the operation part 37 (step S206: light quantity distribution measurement of the secondary light source). Next, the controller 18 causes the first driver 35 to move the position of the light source 1 in the X- and Y-axis directions such that the symmetry of the obtained light intensity distribution becomes the highest level (step S207: second position adjustment). Note that, since the position of the light source 1 in the Z-axis direction does not affect the symmetry of the light intensity distribution, there is no need to move the position of the light source 1 in the Z-axis direction in step S207. On the other hand, if the controller 18 determines in step S204 that the illuminating condition does not need to be switched (No), the processing shifts to step S208 as it is.

Next, after adjustment in position of the light source 1 in the Z-axis direction in step S203, the controller 18 determines whether or not a predetermined time has elapsed (step S208). A predetermined time may be a time at which the illuminance is lowered by 3% based on the assumption that the light source 1 is turned on while the input remains constant and a lamp replacement is performed at a time point when the illuminance is lowered by 30%. Here, if the controller 18 determines that a predetermined time has elapsed (Yes), the controller 18 causes the operation part 37 to compute the total light quantity of an image of the secondary light source based on the output of the detector 17 so as to acquire information about the total light quantity from the operation part 37 (step S209: second light quantity measurement of the secondary light source). Next, the controller 18 causes the first driver 35 to move the position of the light source 1 in the Z-axis direction such that the value of the obtained total light quantity becomes the maximum value (step S210: third position adjustment). After the position of the light source 1 is moved in the Z-axis direction in step S210, the illumination system 12 is ready for illuminating the reticle R. For example, the illumination system 12 illuminates the reticle R by opening (turning ON) an exposure shutter (not shown) provided in the illumination system 12. The exposure step (exposure sequence) performed by the exposure apparatus 700 is started with the start of illumination of the reticle R. The reason why such an adjustment can be made is because the change in total light quantity of the light intensity distribution occurs by a change of the light emitting point 1a in the Z-axis direction due to exhaustion of the electrodes of the light source 1 associated with turning on the same. On the other hand, if the controller 18 determines in step S208 that a predetermined time has not yet elapsed (No), the illumination system 12 is ready for illuminating the reticle R, and thus, illuminates the reticle R so that the exposure step performed by the exposure apparatus 700 can be started.

Next, upon completion of the exposure step performed by the exposure apparatus 700, the controller 18 determines whether or not the lighting time of the light source 1 has reached its replacement time (lifetime) (step S211). Here, if the controller 18 determines that the lighting time of the light source 1 has reached its replacement time (Yes), the controller 18 turns off the light source 1 (step S212), and ends the adjustment step of the secondary light source. On the other hand, if the controller 18 determines in step S211 that the lighting time of the light source 1 has not yet reached its replacement time (No), the processing returns to step S204. If there is no need to switch the illuminating condition and a predetermined time has not yet elapsed, the illumination system 12 is again ready for illuminating the reticle R so as to execute the exposure step performed by the exposure apparatus 700. When the change in the total light quantity of an image of the secondary light source or the symmetry of the light intensity distribution is greater than a predetermined value (permissible value) by a constant monitoring of the light intensity distribution of an image of the secondary light source by the controller 18, the position of the light source 1 may be adjusted in the X-, Y-, and Z-axis directions as appropriate.

As described above, since the illumination system 12 does not use a circular cone prism, a stop, or the like as is conventional for changing the shape of an image of the secondary light source, a loss in light quantity can be suppressed as much as possible. In addition, the illumination system 12 moves the reflection mirrors constituting the condenser mirror 3 as appropriate based on the above configuration, so that an image of the secondary light source can be readily made in an annular shape or a circular shape. Furthermore, the illumination system 12 uses a different plurality of incident optical systems 191 and 192 for different purposes in concert with the movement of the reflection mirrors constituting the condenser mirror 3, so that an image of the secondary light source can be changed into various shapes.

As described above, according to the present embodiment, an illumination device that can readily form an image of the secondary light source into a desired annular shape or a desired circular shape while suppressing a loss in light quantity may be provided. In addition, an exposure apparatus including such an illumination device enables high efficiency and power saving.

Figure 24:
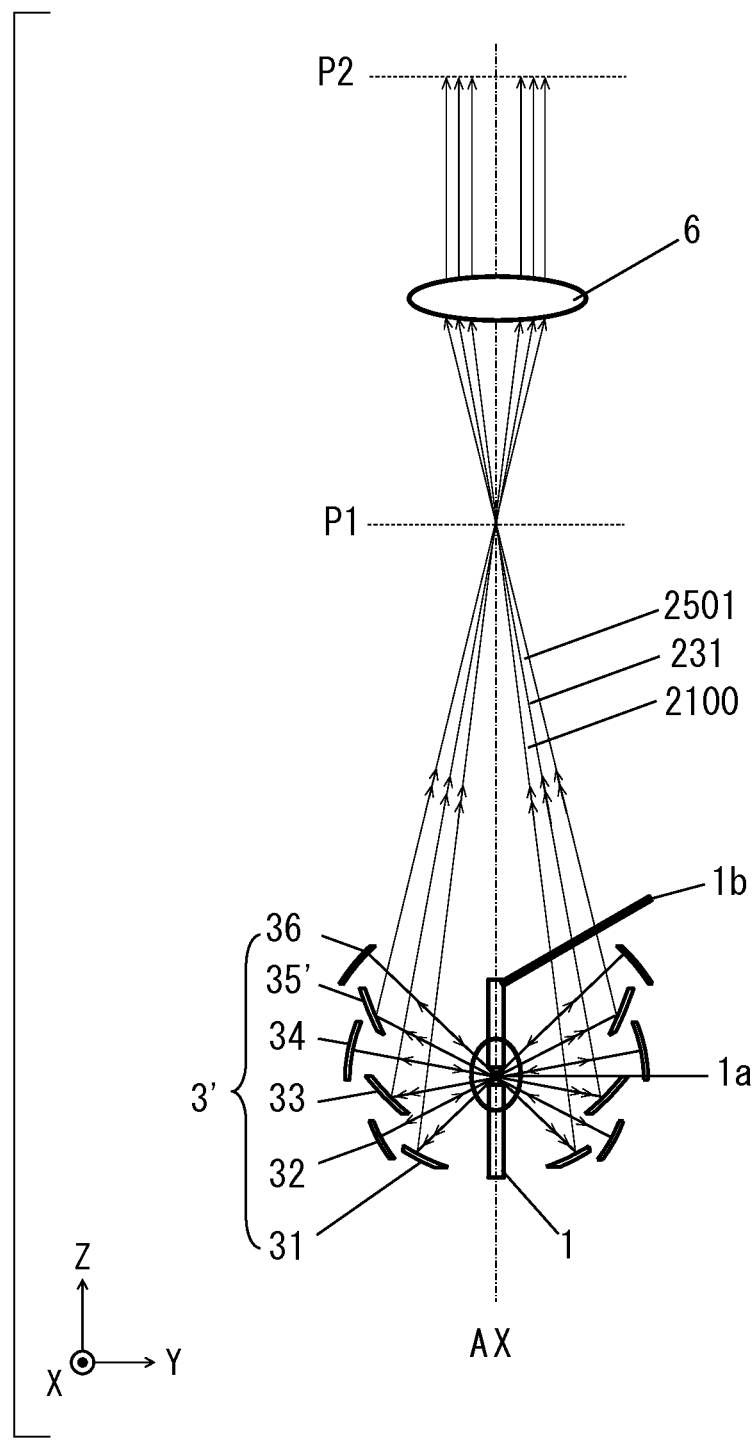
FIG. 24 is a diagram illustrating another configuration of an illumination system for explaining a light intensity distribution.

In the above description, a description has been given of the case where, in the illumination system 12, the condenser mirror 3 consists of a five-stage structured reflection mirror. However, the number of stages of the reflection mirrors constituting the condenser mirror 3 is not limited thereto in the present invention but may be changed as appropriate. Hereinafter, a specific description will be given of other configurations of the condenser mirror 3 with reference to FIGS. 24 to 26. FIGS. 24 to 26 are schematic views illustrating an optical system for explaining the light intensity distribution formed by the light flux emitted from the light source 1, which are in compliance with the methods shown in FIGS. 14 and 15.

FIG. 24 shows the reference state of the condenser mirror 3' consisting of a six-stage structured reflection mirror. The condenser mirror 3' is configured such that the outermost third elliptical mirror 35 which is on the side of the second focal position shown in FIG. 14A is replaced with a fourth elliptical mirror 35' and a third spherical mirror 36. Here, it can be seen that the fourth elliptical mirror 35' is cut out of a part of the third elliptical mirror 35 shown in FIG. 14A. A light flux 2501 includes the light flux condensed only by the fourth elliptical mirror 35' and the light flux condensed by the fourth elliptical mirror 35' after being reflected by the first spherical mirror 32. On the other hand, the center of curvature of the third spherical mirror 36 coincides with the center of curvature of the first spherical mirror 32 and the second spherical mirror 34, and the focal position of the third spherical mirror 36 coincides with the first focal positions of the elliptical mirrors 31, 33, and 35'. A light flux 2100 includes the light flux condensed only by the first elliptical mirror 31 and the light flux condensed by the first elliptical mirror 31 after being reflected by the third spherical mirror 36. In this case, three elliptical mirrors 31, 33, and 35' are paired with three individual spherical mirrors 36, 34, and 32, and the condenser mirror 3' condenses the light flux from the light emitting point 1a. The light fluxes 2100, 231, and 2501 condensed by the elliptical mirrors 31, 33, and 35', respectively, may change the peak intensity in the light intensity distribution formed at the first position P1 or the second position P2 by altering the positions of the spherical mirrors 36, 34, and 32 in the Z-axis direction. Thus, a six-stage structured condenser 3' shown in FIG. 24 can change the light intensity distribution formed at the first position P1 or the second position P2 over a wider range as compared with the five-stage structured condenser mirror 3 shown in FIG. 14A.

FIG. 25A shows the reference state of the condenser mirror 3" consisting of a two-stage structured reflection mirror. The condenser mirror 3" includes two elliptical mirrors, i.e., the first elliptical mirror 31" and the second elliptical mirror 33". Here, the first elliptical mirror 31" and the second elliptical mirror 33" are two divided portions of one elliptical mirror, and the first focal positions and the second focal positions of the first elliptical mirror 31" and the second elliptical mirror 33" respectively coincide with each other. In this case, a light flux 2103 is condensed after being reflected by the first elliptical mirror 31". On the other hand, a light flux 2302 is condensed after being reflected by the second elliptical mirror 33".

FIG. 25B shows a state where the positions of the elliptical mirrors 31" and 33" constituting the condenser mirror 3" are moved from the reference state shown in FIG. 25A. In particular, in the example shown in FIG. 25B, the first elliptical mirror 31" is moved in the −Z direction. On the other hand, the second elliptical mirror 33" is moved in +Z direction. In this case, a light flux 2104 is reflected by the first elliptical mirror 31" and then is condensed at a position which is to the negative side of the first position P1 in the Z-axis direction to be incident on the Fourier transform optical system 6. The light flux 2104 incident on the Fourier transform optical system 6 is converted into a substantially collimated light flux. Consequently, a light intensity distribution of an annular shape is formed at the second position P2 on the pupil plane of the Fourier transform optical system 6. At this time, the light flux 2104 is condensed at a position closer to the condenser mirror 3" than the first position P1, and thus, is incident on the Fourier transform optical system 6 at a larger angle than that of the light flux 2103 in FIG. 25A. On the other hand, a light flux 2303 is reflected by the second elliptical mirror 33" and then is condensed at a position which is to the positive side of the first position P1 in the Z-axis direction to be incident on the Fourier transform optical system 6. The light flux 2303 incident on the Fourier transform optical system 6 is converted into a substantially collimated light flux. Consequently, a light intensity distribution of an annular shape is formed at the second position P2 on the pupil plane of the Fourier transform optical system 6. At this time, the light flux 2303 is condensed at a position distant from the condenser mirror 3" than the first position P1, and thus, is incident on the Fourier transform optical system 6 at a smaller angle than that of the light flux 2302 in FIG. 25A.

As shown in FIGS. 25A and 25B, in order to change a light intensity distribution of an annular shape formed at the second position P2, the inner diameter and the outer diameter of a light intensity distribution of an annular shape can be independently changed by at least two elliptical mirrors which are the minimum configuration of the condenser mirror 3.

Here, in the condenser mirror 3" constituted only by the elliptical mirrors shown in FIG. 25B, a portion of the light flux emitted from the light source 1 leaks as leaked light 2000 to the outside from a gap between the first elliptical mirror 31" and the second elliptical mirror 33" in the optical axis direction. Such leakage of light is a loss in light quantity, and thus, is preferably avoided as much as possible. Accordingly, it is effective that the condenser is configured as shown in FIGS. 26A and 26B as follows in order to suppress the occurrence of the leaked light 2000.

FIG. 26A shows the reference state of the condenser mirror 3''' consisting of a three-stage structured reflection mirror. The condenser mirror 3''' is additionally provided with a spherical mirror between elliptical mirrors as compared with the configuration shown in FIGS. 25A and 25B, and includes the first elliptical mirror 31''', the second elliptical mirror 33''', and a spherical mirror 32'''. Here, the first focal position of the first elliptical mirror 31''' coincides with that of the second elliptical mirror 33''' and the second focal position of the first elliptical mirror 31''' also coincides with that of the second elliptical mirror 33'''. The second focal positions of the first elliptical mirror 31''' and the second elliptical mirror 33''' coincide with the first position P1. The center of curvature of the spherical mirror 32''' coincides with the first focal positions of the first elliptical mirror 31''' and the second elliptical mirror 33'''. In this case, the light flux 2104 is condensed after being reflected by the first elliptical mirror 31'''. On the other hand, a light flux 2304 is reflected by the spherical mirror 32''' and then is further reflected by the second elliptical mirror 33''' so as to be condensed.

FIG. 26B shows a state where the positions of the elliptical mirrors 31''' and 33''' constituting the condenser mirror 3''' are moved from the reference state shown in FIG. 26A. In particular, in the example shown in FIG. 26B, the first elliptical mirror 31''' is moved in the −Z direction. On the other hand, the second elliptical mirror 33''' is moved in +Z direction. In this case, a light flux 2105 is reflected by the first elliptical mirror 31''' and then is condensed at a position which is to the negative side of the first position P1 in the Z-axis direction to be incident on the Fourier transform optical system 6. The light flux 2105 incident on the Fourier transform optical system 6 is converted into a substantially collimated light flux. Consequently, a light intensity distribution of an annular shape is formed at the second position P2 on the pupil plane of the Fourier transform optical system 6. At this time, a light flux 2105 is condensed at a position closer to the condenser mirror 3''' than the first position P1, and thus, is incident on the Fourier transform optical system 6 at a larger angle than that of the light flux 2104 in FIG. 26A. On the other hand, a light flux 2305 is reflected by the second elliptical mirror 33''' and then is condensed at a position which is to the positive side of the first position P1 in the Z-axis direction to be incident on the Fourier transform optical system 6. The light flux 2305 incident on the Fourier transform optical system 6 is converted into a substantially collimated light flux. Consequently, a light intensity distribution of an annular shape is formed at the second position P2 on the pupil plane of the Fourier transform optical system 6. At this time, the light flux 2305 is condensed at a position distant from the condenser mirror 3''' than the second position P2, and thus, is incident on the Fourier transform optical system 6 at a smaller angle than that of the light flux 2304 in FIG. 26A.

With the aid of the configuration as shown in FIGS. 26A and 26B, no leaked light 2000 shown in FIG. 25B occurs even upon movement of the elliptical mirrors, a light intensity distribution of an annular shape formed at the first position P1 can be changed as in the case shown in FIGS. 25A and 25B.

In consideration of the above illustration, the illumination device according to the present embodiment may provide the effect as described above provided that the condenser includes at least two movable elliptical mirrors and fixed or movable spherical mirror(s) which is/are an equal number or less (including zero) of these elliptical mirrors.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a latent image pattern on an object (e.g., exposure process) using the aforementioned exposure apparatus; and a step of developing the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-159144 filed on Aug. 5, 2014, and Japanese Patent Application No. 2014-184748 filed on Sep. 11, 2014, which are hereby incorporated by reference herein in their entirety.

What is claimed is:

1. A light source apparatus comprising:
a light source configured to emit a light flux from an emission region; and
a condenser configured to condense the light flux so as to allow the light flux to exit the outside,
wherein
the condenser includes four or more reflection mirrors each having a reflecting surface for reflecting the light flux emitted from the emission region,
and the four or more reflection mirrors are disposed so as to surround the light source,
the four or more reflection mirrors include elliptical surface reflection mirrors of which the reflecting surface is elliptical and spherical surface reflection mirrors of which the reflecting surface is spherical, and
the elliptical surface reflection mirrors and the spherical surface reflection mirrors are alternately arranged in the direction of an axis, and a light flux reflected by a spherical surface reflection mirror is further reflected by an elliptical surface reflection mirror so as to allow the light flux to exit to the outside.

2. The light source apparatus according to claim 1, wherein the spherical surface reflection mirror has a central point of the spherical surface in the emission region and the elliptical surface reflection mirror has a focal point in the emission region.

3. The light source apparatus according to claim 1, wherein the range of the angle θ' over which the spherical surface reflection mirror reflects a light flux from the emission region in a plane including the axis and the range of the angle θ over which the one elliptical surface reflection mirror further reflects a light flux reflected by the spherical surface reflection mirror in the plane including the axis satisfy the relationship of θ≧θ'.

4. The light source apparatus according to claim 1, wherein the light source has a cathode and an anode for forming the emission region.

5. The light source apparatus according to claim 4, wherein, when the elliptical surface reflection mirror and the spherical surface reflection mirror are adjacent to each other across the emission region, the aperture end of the elliptical surface reflection mirror on the side adjacent the spherical surface reflection mirror is overhung by a distance which is ½ or longer than that between the cathode and the anode from the emission region toward the spherical surface reflection mirror.

6. The light source apparatus according to claim 4, wherein an angle at which the light source emits the light flux toward the cathode in a plane including the axis is equal to an angle at which the light source emits the light flux toward the anode in the plane including the axis.

7. An illumination device comprising:
the light source apparatus according to claim 1; and
an optical integrator on which the light flux emitted from the light source apparatus is incident.

8. The illumination device according to claim 7, further comprising:
a columnar waveguide which is disposed between the condenser and the optical integrator and on which the light flux condensed by the condenser is incident; and
an optical system which is disposed between the waveguide and the optical integrator so as to convert the light flux emitted from the waveguide into a collimated light flux.

9. The illumination device according to claim 8, further comprising:
a light flux convertor which is detachably disposed between the optical system and the optical integrator so as to change the shape of the light flux to be incident on the optical integrator.

10. An exposure apparatus that transfers an image of a pattern formed on an original onto a substrate, the exposure apparatus comprising:
the illumination device according to claim 7,
a projection optical system configured to project a pattern of the original onto the substrate,
wherein the illumination device illuminates the original which is an object to be irradiated.

11. The light source apparatus according to claim 1, wherein each reflecting surface is rotationally symmetrical about an optical axis defined as the rotationally symmetrical axis of the emission region.

12. The light source apparatus according to claim 1, wherein the emission region has a rotationally symmetrical emission intensity distribution about the axis.

13. The light source apparatus according to claim 1, wherein each reflecting surface is rotationally symmetrical about the axis.

14. The light source apparatus according to claim 1, wherein the light flux reflected by the spherical surface reflection mirror is incident on the elliptical surface reflection mirror across the emission region and is further reflected by the elliptical surface reflection mirror so as to allow the light flux to exit to the outside.

15. The light source apparatus according to claim 1, wherein each reflecting surface is formed so as to surround the axis.

16. A method of manufacturing an article, the method comprising steps of:
exposing a substrate using an exposure apparatus, and,
developing the substrate exposed in the exposing,
wherein the article is obtained from the developed substrate,
wherein the exposure apparatus is configured to transfer an image of a pattern formed on an original onto the substrate, and includes:
an illumination device,
a projection optical system configured to project a pattern of the original onto the substrate,
wherein the illumination device is configured to illuminate the original which is an object to be irradiated, and includes:
a light source apparatus; and
an optical integrator on which a light flux emitted from the light source apparatus is incident,
wherein the light source apparatus includes:
a light source configured to emit the light flux from an emission region; and
a condenser configured to condense the light flux so as to allow the light flux to exit to the outside,
wherein the condenser includes four or more reflection mirrors each having a reflecting surface for reflecting the light flux emitted from the emission region,
and the four or more reflection mirrors are disposed so as to surround the light source,
the four or more reflection mirrors include elliptical surface reflection mirrors of which the reflecting surface is elliptical and spherical surface reflection mirrors of which the reflecting surface is spherical, and
the elliptical surface reflection mirrors and the spherical surface reflection mirrors are alternately arranged in the direction of an axis, and a light flux reflected by a spherical surface reflection mirror is further reflected by an elliptical surface reflection mirror so as to allow the light flux to exit to the outside.

* * * * *